United States Patent
Kono et al.

[11] Patent Number: 5,972,756
[45] Date of Patent: Oct. 26, 1999

[54] METHOD OF FABRICATING SEMICONDUCTOR DEVICE WITH A FUSE PORTION

[75] Inventors: Takashi Kono; Mikio Asakura; Hideto Hidaka; Kenichi Yasuda, all of Tokyo, Japan

[73] Assignee: Mitsubishi Denki Kabushiki Kaisha, Tokyo, Japan

[21] Appl. No.: 08/908,000

[22] Filed: Aug. 11, 1997

Related U.S. Application Data

[63] Continuation of application No. 08/683,275, Jul. 18, 1996, abandoned.

[30] Foreign Application Priority Data

Nov. 30, 1995 [JP] Japan .................................. 7-312410

[51] Int. Cl.⁶ ................................................ H01L 21/82
[52] U.S. Cl. ........................................... 438/281; 438/132
[58] Field of Search .................................. 438/132, 238, 438/239, 281, 601

[56] References Cited

U.S. PATENT DOCUMENTS

| | | | |
|---|---|---|---|
| 4,455,194 | 6/1984 | Yabu et al. | 438/601 |
| 4,536,949 | 8/1985 | Takayama et al. | 437/922 |
| 4,628,590 | 12/1986 | Udo et al. | 437/60 |
| 4,853,758 | 8/1989 | Fischer | 257/529 |
| 5,279,984 | 1/1994 | Kinoshita et al. | 438/132 |
| 5,296,402 | 3/1994 | Ryou | 437/915 |
| 5,324,681 | 6/1994 | Lowrey et al. | 437/922 |

*Primary Examiner*—Chandra Chaudhari
*Attorney, Agent, or Firm*—McDermott, Will & Emery

[57] ABSTRACT

In a method of fabricating a semiconductor device, an interlayer insulating film is selectively etched to remove a level difference at an area of the interlayer insulating film on a cell plate on cylindrical capacitors and simultaneously form a concave portion on a fuse portion. Since the etching is ended to a degree that the cell plate is not exposed, the concave portion can be formed on the fuse portion not exposed. This does not add a step of forming a protection film on the fuse portion.

14 Claims, 17 Drawing Sheets

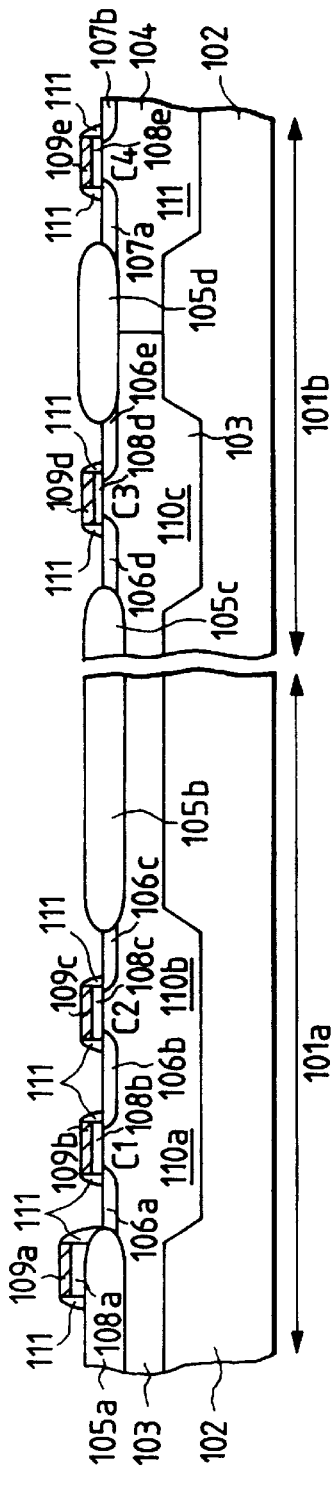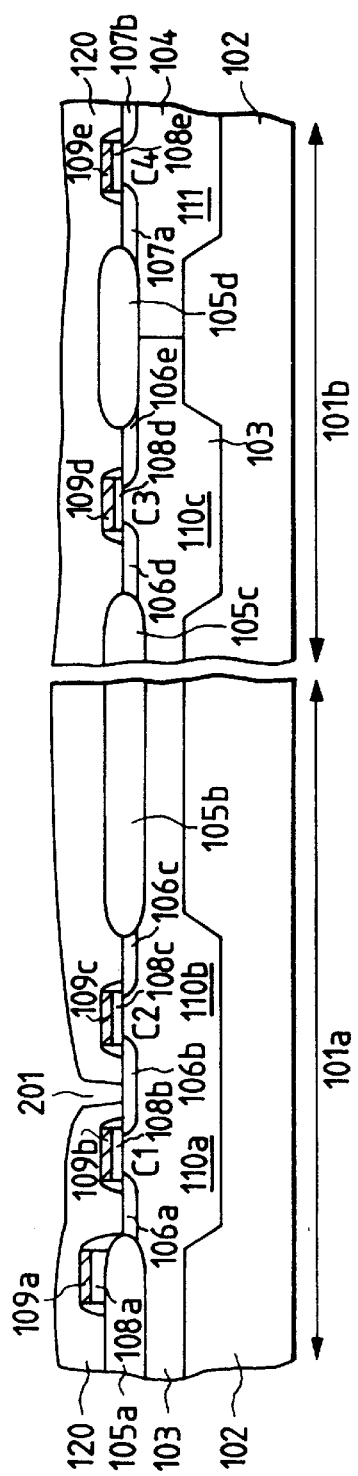

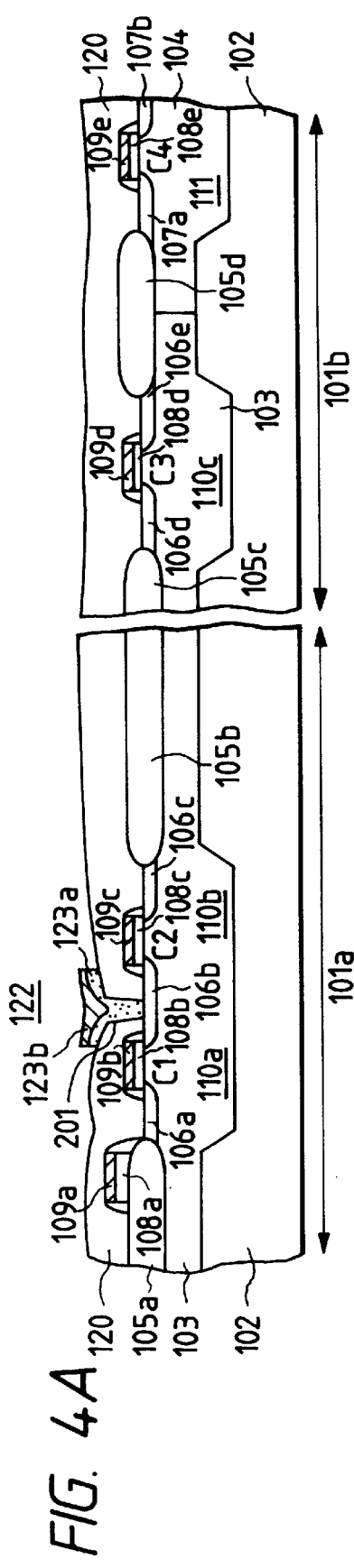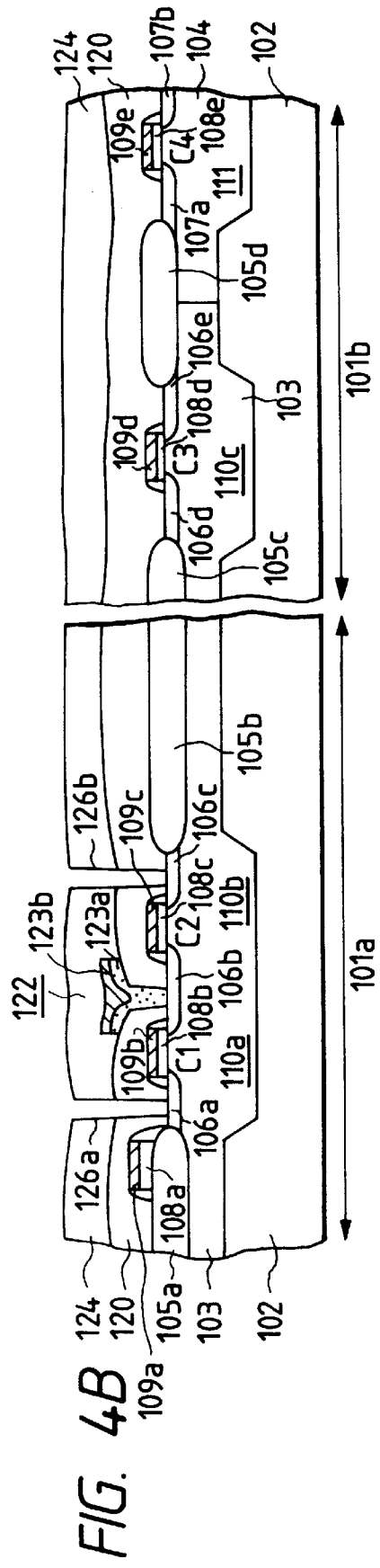

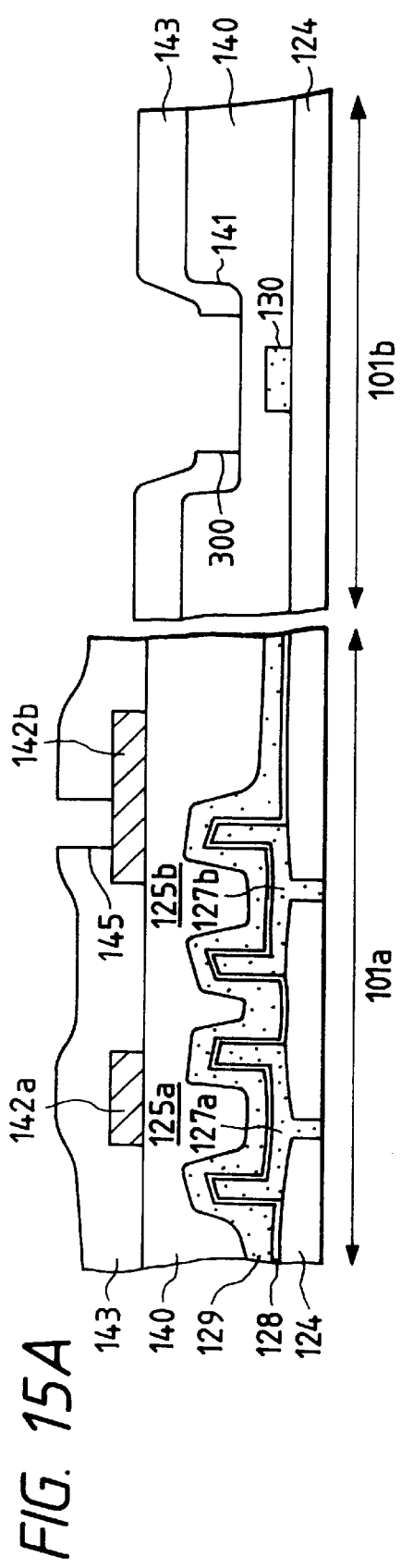
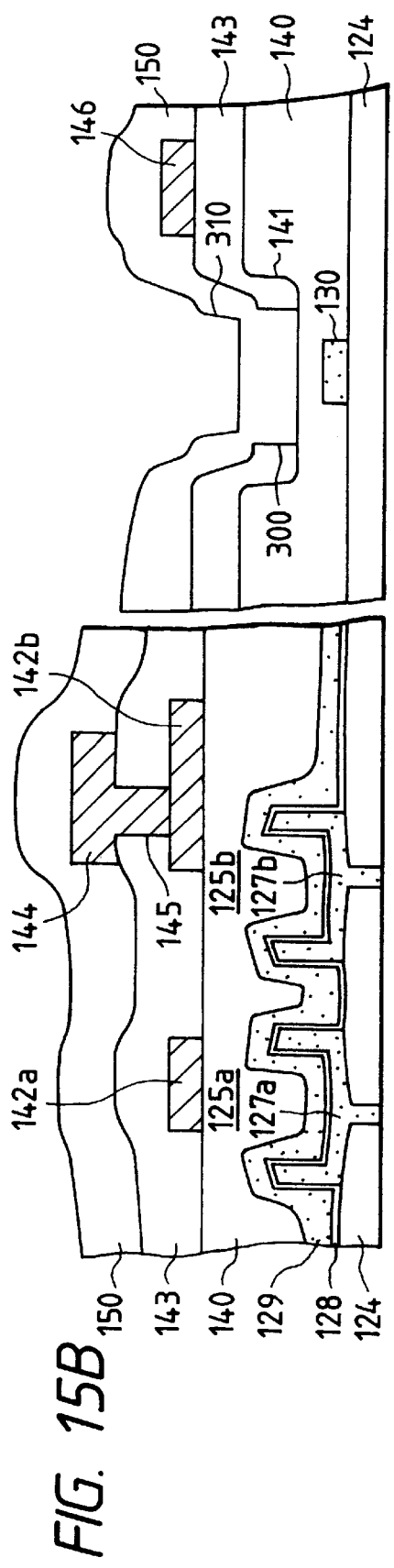

METHOD OF FABRICATING SEMICONDUCTOR DEVICE WITH A FUSE PORTION

This application is a continuation of Application Ser. No. 08/683,275 now abandoned filed Jul. 18, 1996.

BACKGROUND OF THE INVENTION

1. Field of the Invention

The present invention relates to a method of fabricating a semiconductor device equipped with a fusing portion which will be cut for defect relief, and more particularly to a method of fabricating a semiconductor device which forms an opening for easily cutting the fuse portion.

2. Description of the Prior Art

Generally, semiconductor devices in which elements such as transistors are integrated on a semiconductor substrate are subjected to wafer test before packaging to test whether it can carry out a prescribed operation. In this case, even when a failure chip with poor elements is found in the test, in order that the chip can carry out a normal operation without being fabricated again, a spare element previously formed in the same chip is substituted for the poor element. Such a technique has been commonly adopted to relieve the failure chip. Further, when a poor element is found in a memory array section, another block unit in a spare memory cell array is substituted for the block unit incorporating the poor element. The spare element is substituted for the poor element in such a manner that a fuse formed as a part of wiring is physically cut. For example, the semiconductor device is provided with a spare memory array as well as a memory array section. In such a structure, when a row decoder or column decoder for selecting each block receives an address signal selecting a block incorporating a poor element, a fuse is cut. Thus, without accessing the poor block, the spare block in place of it will be accessed.

The fuse can be cut by several methods. A method which has been widely adopted is laser trimming in which the fuse is molten and cut by laser irradiation. FIGS. 17A to 17C are sectional views of a semiconductor device which show the conventional method of laser trimming. In FIG. 17A, reference numeral 1 denotes a semiconductor substrate; 2 a first inter-layer insulating film formed on the semiconductor substrate; 3 a fuse portion formed on the first inter-layer insulating film; 4 a second inter-layer insulating film formed on the fuse portion 3 and the first inter-layer insulating film 2; and 5 a wiring layer serving as an electric pad formed on the second inter-layer insulating film 4.

As seen from FIG. 17B, the second inter-layer insulating film 4 is selectively removed by etching to form an opening above the fuse portion 3. In this step, the circuit formed on the semiconductor substrate is subjected to wafer test. A test signal is supplied through the wiring layer (electrode pad) 5. When it is found as a result of test that the fuse portion 3 must be cut, the fuse portion 3 is cut by irradiation of laser light rays 7 through the opening 6. Thereafter, as seen from FIG. 17C, a passivation film 8 serving as a final protection film is formed on the entire surface of the second inter-layer insulating film 4 and in the opening 6. Further, another opening 9 is made in the passivation film 8 by etching so that the electrode pad 5 is exposed.

The opening 6 is formed in order to reduce the thickness of the insulating film on the fuse portion 3 to a degree that the fuse portion 3 can be easily cut by irradiation of the laser light rays 7. In this case, in order to form the opening 6, a step of etching a resist formed using a photomask is required. For this purpose, the second inter-layer insulating film 4 is etched so that a contact hole is formed at the portion not shown of the second inter-layer insulating film 4 and the opening 6. Thus, the normal contact hole made in the inter-layer insulating film and the opening 6 can be formed in the same step using the same mask. For example, Postexamined Japanese Patent Pubication 4-79138 discloses that as shown in FIG. 18, in the same PSG film a, a contact hole b brought into contact with the source/drain regions c of an MOS transistor and an opening d formed on the fuse portion e on a field layer f can be formed simultaneously. A protection layer q is formed on the fuse portion e.

The technique described above has the following drawbacks. Where the contact hole b and fuse portion e are formed simultaneously, the fuse portion e is exposed. Exposure of the fuse portion e may lead to its break because of an accidental cause. In order to prevent this, a protection film q is previously formed on the fuse surface as shown in FIG. 18 thereby to prevent exposure of the fuse surface. In the above reference, a protection film q having a double layer structure composed of a polysilicon layer and a molybdenum silicide layer is formed on the fuse surface. However, this requires an additional step of forming the protection film. Further, in the above reference, the protection film g is formed of the same material and in the same step as the gate electrode of an MOS transistor. However, in the multi-layered structure of a semiconductor device, the fuse portion is formed on a more upper layer so that it can be easily broken. For this reason, the protection film cannot be necessarily formed simultaneously with the gate electrode.

SUMMARY OF THE INVENTION

An object of the present invention is to provide a method of fabricating a semiconductor device for forming an opening for fuse cutting while protecting a fuse portion without adding a step of forming a protection film.

In order to attain the above object, in accordance with a first aspect of the present invention, there is provided a method of fabricating a semiconductor device comprising the steps of: forming a first insulating film constituting a first inter-layer insulating film on a principle surface of a semiconductor substrate; forming, on the first insulating film, a first conductive layer constituting a fuse portion on the first insulating film and a second conductive layer constituting a part of a circuit to be formed on a semiconductor substrate; depositing a second insulating film constituting a second inter-layer insulating film on the first insulating film so as to cover the first and second conductive layers; and selectively etching the second insulating layer to remove a convex level difference of the surface area of the second insulating film located above the second conduction layer from that located above the first conductive layer to a degree that the second conductive layer is not exposed and also to form a concave portion in the surface of the second insulating film so that its bottom is opposite to the first conductive layer through second insulating film.

Further, according to the present invention, the method of fabricating a semiconductor device further comprises the steps of: depositing a third insulating film on the second insulating film inclusive of the concave portion; forming a third conductive layer on the surface of the third insulating film at the other area than an area located at the concave portion; depositing a fourth insulating film on the third insulating film inclusive of the area located at the concave portion so as to cover the third conductive layer; and selectively etching the fourth insulating film so as to make simultaneously, from its surface, a first opening in contact with the third conductive layer and a second opening having a bottom opposite to the first conductive layer through the second and third insulating film.

Furthermore, in a method of fabricating a semiconductor device according to the invention, the third insulating film and the insulating film are made of different materials.

Particularly, in a method of fabricating a semiconductor device according to the invention, the third insulating film is made of an oxide film and the fourth insulating film is made of a nitride film.

Moreover, a method of fabricating a semiconductor device according to the invention further comprises the steps of: forming a third conductive layer on the surface of the second insulating film at the other area than an area located at the concave portion; depositing a third insulating film on the second insulating film inclusive of the area located at the concave portion so as to cover the third insulating film; and selectively etching the third insulating film so as to make simultaneously, from its surface, a first opening in contact with the third conductive layer and a second opening having a bottom opposite to the first conductive layer through the second insulating film.

Still further, in a method of fabricating a semiconductor device according to the present invention, the second conductive layer serves as the other electrode opposite to one electrode of a cylindrical capacitor formed on the first insulating film and whose axis is perpendicular to the principal surface of the semiconductor substrate.

In accordance with the second aspect of the present invention, there is provided a method of fabricating a semiconductor device comprising the steps of: forming a first insulating film constituting a first inter-layer insulating film on a principle surface of a semiconductor substrate; forming, on the first insulating film, a first conductive layer constituting a fuse portion on the first insulating film and a second conductive layer constituting a part of a circuit to be formed on a semiconductor substrate; depositing a second insulating film constituting a second inter-layer insulating film on the first insulating film so as to cover the first and second conductive layers; forming a third conductive layer constituting a wiring layer on the surface of the second insulating film at the other area than an area located at the first conductive layer; depositing a third insulating film on the second insulating film inclusive of the area located at the first conductive layer so as to cover the third conduction layer; and selectively etching the third insulating film so as to make simultaneously, from its surface, a first opening in contact with the third conductive layer and a second opening having a bottom opposite to the first conductive layer through the insulating film; forming a fourth conductive layer constituting a wiring layer on the surface of the third insulating film at the other area than an area located at the second opening, the fourth conductive layer including a portion connected to the third conductive layer through the first opening; depositing a fourth insulating film in the second opening and on the third insulating film inclusive of the area located at the first conductive layer so as to cover the fourth conductive layer; and selectively etching the fourth insulating film so as to make simultaneously, from its surface, a third opening in contact with the fourth conductive layer and a fourth opening having a bottom opposite to the first conductive layer through the second insulating film in the second opening.

As described above, according to the invention, the surface of the second insulating film constituting an inter-layer insulating film is selectively etched to remove a convex level difference of the surface area of the second insulating film located above the second conductive layer constituting a part of the circuit from that located above the first conductive layer constituting a fuse portion to a degree that the second conductive layer is not exposed and also to form a concave portion in the surface of the second insulating film so that its bottom is opposite to the first conductive layer through second insulating film. Thus, removing the convex level difference and forming the concave portion without exposing the first conductive layer constituting a fuse portion can be carried out with no additional fabrication step. The film thickness on the fuse portion can be reduced while protecting the fuse portion. This makes it easy to cut the fuse portion by laser irradiation.

The fourth insulating film is selectively etched so as to make simultaneously, from its surface, a first opening in contact with the third conductive layer and a second opening having a bottom opposite to the first conductive layer through the second and third insulating film. Forming the second opening can reduce the film thickness on the fuse portion, thus making it easy to cut the fuse portion by laser irradiation. Since the second opening is formed simultaneously with the first opening in contact with the third conductive layer, it can be formed without increasing the number of fabrication steps.

The third insulating film is selectively etched so as to make simultaneously, from its surface, a first opening in contact with the third conductive layer and a second opening having a bottom opposite to the first conductive layer through the second insulating film. Forming the second opening can further reduce the film thickness on the fuse portion, thus making it easy to cut the fuse portion by laser irradiation. Since the second opening is formed simultaneously with the first opening in contact with the third conductive layer, it can be formed without increasing the number of fabrication steps.

In accordance with another method of fabricating a semiconductor device according to the present invention, where multiple wiring layers such as the third and fourth conductive layers are formed on the second insulating film so as to cover the first conductive layer constituting the fuse portion, since the second and fourth openings for reducing the film thickness on the fuse portion are formed on the first conductive layer through the second insulating film, respectively, the film thickness on the fuse portion can be reduced, this making it easy to cut the fuse portion by laser irradiation. Further, since the second opening is formed simultaneously with the first opening in contact with the third conductive layer constituting a wiring layer by etching removal, and the fourth opening is formed simultaneously with the third opening in contact with the fourth conductive layer constituting another wiring layer by etching removal, the second and fourth openings can be formed without increasing the number of fabricating steps.

The above and other objects and features of the present invention will be more apparent from the following description taken in conjunction with the accompanying drawings.

BRIEF DESCRIPTION OF THE DRAWINGS

FIGS. 3A to 13 are sectional structural views of a semiconductor device showing individual steps of a method of fabricating the semiconductor device shown in FIG. 1;

FIGS. 15A and 15B and 16 are sectional structural views of a semiconductor device showing individual steps of a method of fabricating a semiconductor device according to the second embodiment of the present invention;

DESCRIPTION OF THE PREFERRED EMBODIMENTS

Embodiment 1

Figure 1:
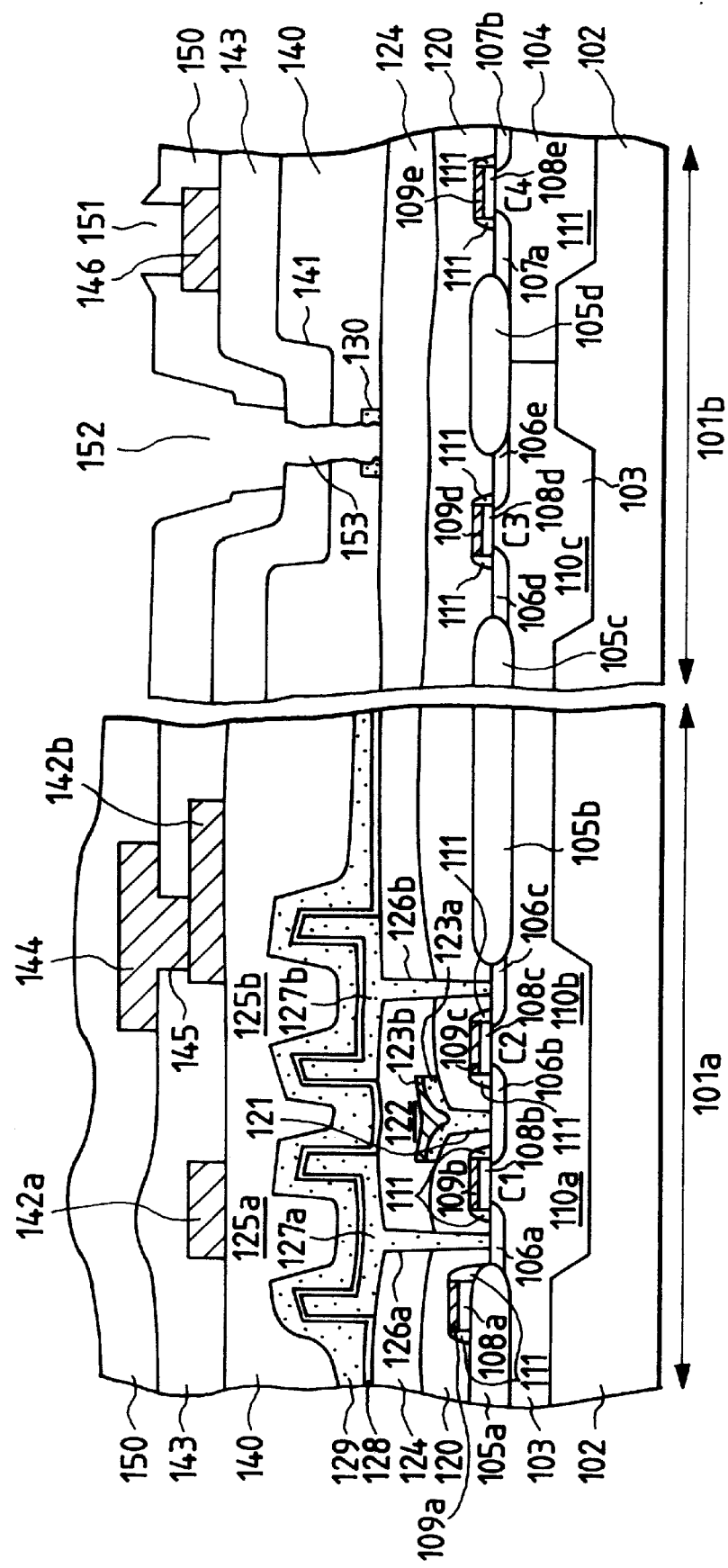
FIG. 1 is a sectional view of a semiconductor device (DRAM) according to the first embodiment of the present invention.

An explanation will be given of the first embodiment of the present invention. FIG. 1 is a sectional structural view showing a semiconductor device according to the present invention, more specifically shows a dynamic random access memory (hereinafter referred to as "DRAM") having a cylindrical capacitor. In FIG. 1, there are shown partial sections of a memory array section 101a and a peripheral circuit section 101b inclusive of e.g., a row decoder and a column decoder. In FIG. 1, reference numeral 102 denotes a semiconductor substrate of p-type semiconductor; 103 a p-well formed on the semiconductor substrate 102 and made of p-type semiconductor having a higher impurity concentration than that of the semiconductor substrate 102; 104 an n-well of n-type semiconductor formed on the semiconductor substrate 102; 105a–105d element-isolation regions (insulator such as silicon oxide) for isolating MOS transistors formed on the semiconductor substrate 102 from one another; 106a–106c source/drain regions of n-type semiconductor with regions C1 and C2 formed in parallel apart therefrom in the surface of the p-well 103 between the element isolation regions 105a and 105b; 106d–106e source/drain regions of n-type semiconductor with a region C3 apart therefrom in the surface of the p-well 103; and 107a–107b source/drain regions of p-type semiconductor with a region C4 apart therefrom in the surface of the n-well 104. Reference numeral 108a denotes an insulating oxide film formed on the element isolation region 105a; 108b–108d insulating oxide films formed oppositely to regions C1, C2 and C3 of the p-well 103, respectively; 108e an insulating oxide film formed oppositely to the region C4 of the n-well 104; 109a a conductive layer formed oppositely to the element isolation region 105a through the insulating oxide film 108a; and 109b–109e are gate electrodes formed oppositely to the regions C1 to C4, respectively.

On the side of memory cell array section 101a, the source/drain regions 106a, 106b and the gate electrode 109b constitute an n-channel MOS transistor 110a, and the source/drain regions 106b, 106c and the gate electrode 109c constitutes an n-channel MOS transistor 110b. The conductive layer 109a and the gate electrodes 109b, 109c are formed of a part of word lines arranged in parallel and serve as gate electrodes of MOS transistors not shown. On the other hand, on the side of the peripheral circuit section 101b, the source/drain regions 106d, 106e and the gate electrode 109c constitute an n-channel MOS transistor 110c, and the source/drain regions 107a, 107b and the gate electrode 109e constitute a p-channel MOS transistor 111.

As shown in the figure, on both side walls of the insulating oxide films 108a–108e, and of the conductive layer 109a and the gate electrodes 109b–109e, side wall insulating films 111 of a silicon oxide film are formed.

Further, reference numeral 120 denotes an inter-layer insulating film made of an oxide film of TEOS (Tetre Ethyl Orthosilicate) simultaneously formed on the entire surface of the regions where the memory cell array section 101a and the peripheral circuit section 101b are formed. Reference numeral 121 denotes a contact hole made in the inter-layer insulating film 120. Reference numeral 122 denotes a bit line connected to source/drain region 106b through the contact hole 121 and made of polyside including a portion 123a of n-type polysilicon connected to the source/drain region 106b and a low resistance portion 123b of silicide (e.g. Wsi, MoSi, etc.) formed on the connected portion 123b. Reference numeral 124 denotes an inter-layer insulating film of a TEOS oxide film simultaneously formed on the entire surface of the inter-layer insulating film 120. Reference numerals 125a, 125b denote cylindrical capacitors, respectively. The capacitors 125a, 125b have one electrodes 127a, 127b connected to the source/drain regions 106a, 106c through the contact holes 126a, 126b made in the inter-layers 120, 124, a dielectric film 128 for a capacitor formed on the electrodes 127a, 127b and a cell plate 129 of the other electrode formed oppositely to the electrodes 127a, 127b through the dielectric film 128. The electrodes 127a, 127b and the cell plate 129 are made of n-type doped polysilicon, and the capacitor dielectric film 128 is a stacking layer of a silicon oxide film and a silicon nitride film. The electrodes 127a, 127b are composed of a bottom and a side and have a cylinder shape whose axis is perpendicular to the surface of the inter-layer insulating film 124.

Reference numeral 130 denotes a conductive layer constituting a fuse portion connected to a row decoder and column decoder of the peripheral circuit section 101b at ports not shown. The figure shows the state where the fuse portion has been cut by laser irradiation.

Reference numeral 140 denotes an inter-layer insulating film formed on the surface of the cell plate 129 in the memory cell array section 101a and the surfaces of the fuse portion 130 and inter-layer insulating film 124 in the peripheral circuit section 101b. Reference numeral 141 denotes an concave portion formed in the region located above the conductive layer 130 on the surface of the inter-layer insulating film 140. Reference numerals 142a, 142b denote layers of aluminum formed on the surface of the inter-layer insulating film 140 in the memory array section 101a. Reference numeral 143 denotes an inter-layer insulating film of a TEOS oxide film formed on the entire surface of the inter-layer insulating film 140 so as to cover the wiring layers 142a, 142b and include the concave portion 141. Reference numeral 144 denotes a wiring layer of aluminum connected to the wiring layer 142b through the contact hole 145 made in the inter-layer insulating film 143 and formed on the surface of the inter-layer insulating film 143. Reference numeral 146 denotes a wiring layer of aluminum serving as an electrode pad. Generally, in semiconductor devices, a multi-layer metallic wiring of aluminum is adopted, but in the DRAM at issue a double layer wiring of aluminum is adopted.

Reference numeral 150 denotes a passivation film of a silicon nitride film ($Si_3N_4$) so as to cover the wiring layers 144 and 146; 151 an opening which exposes the wiring layer 146 as an electrode pad; 152 an opening for laser irradiation formed on the passivation film corresponding to the fuse portion; and 153 a portion opened by laser irradiation.

Figure 2:
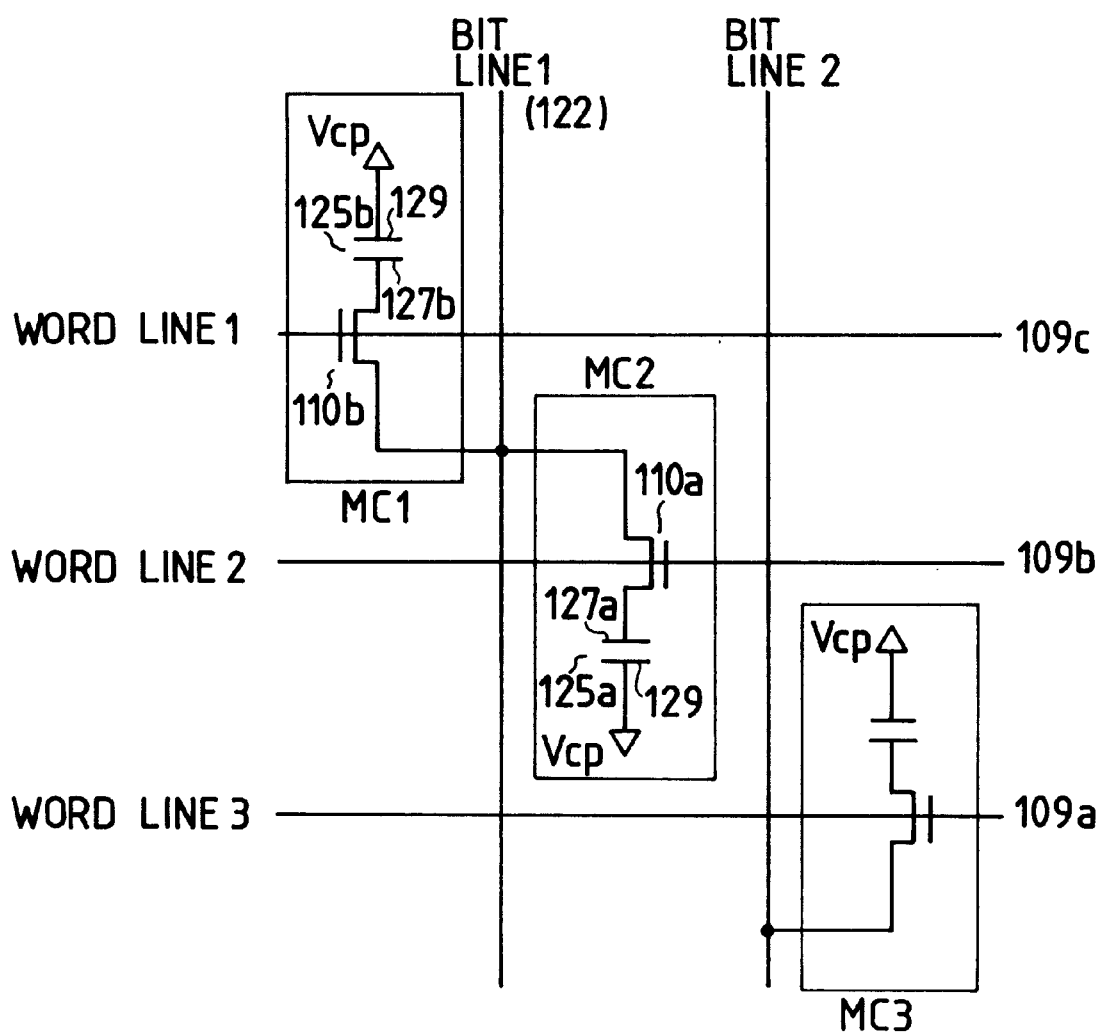
FIG. 2 is a circuit diagram constituting a memory cell structure formed on a memory cell array of DRAM in FIG. 1.

FIG. 2 is a circuit configuration diagram of memory cells formed in the memory cell array section of DRAM shown in FIG. 1. Bit line 1 corresponds to the bit line 122 shown in FIG. 1. Word lines 1, 2 and 3 correspond to the gate electrodes 109c, 109b and the conductive layer 109a as shown in FIG. 1, respectively. In MC1, MOS transistor 110b has a gate electrode connected to the word line 1 and a source/drain whose one terminal and other terminal are connected to the bit line 1 and the one terminal 127b of a capacitor 125b, respectively. In memory cell MC2, MOS transistor 110a has a gate electrode connected to the word line 1 and a source/drain whose one terminal and other terminal are connected to the bit line 1 and the one terminal 127a of the capacitor 125b, respectively. To the other electrode of the capacitor 125a and 125b, i.e., cell plate 129, a cell plate potential Vcp is applied. In MC3 connected to the bit line 2 not shown adjacent to the bit line 1, the gate electrode of a MOS transistor is connected to word line 3. In FIG. 2, like reference numerals refer to like parts in FIG. 1. Particularly, the MC1 and MC2 shown in FIGS. 1 and 2 are memory cells formed at the edge of the area where the memory cell array section is to be formed. These memory cells are cyclically arranged in a row and column direction, respectively.

Figure 13:
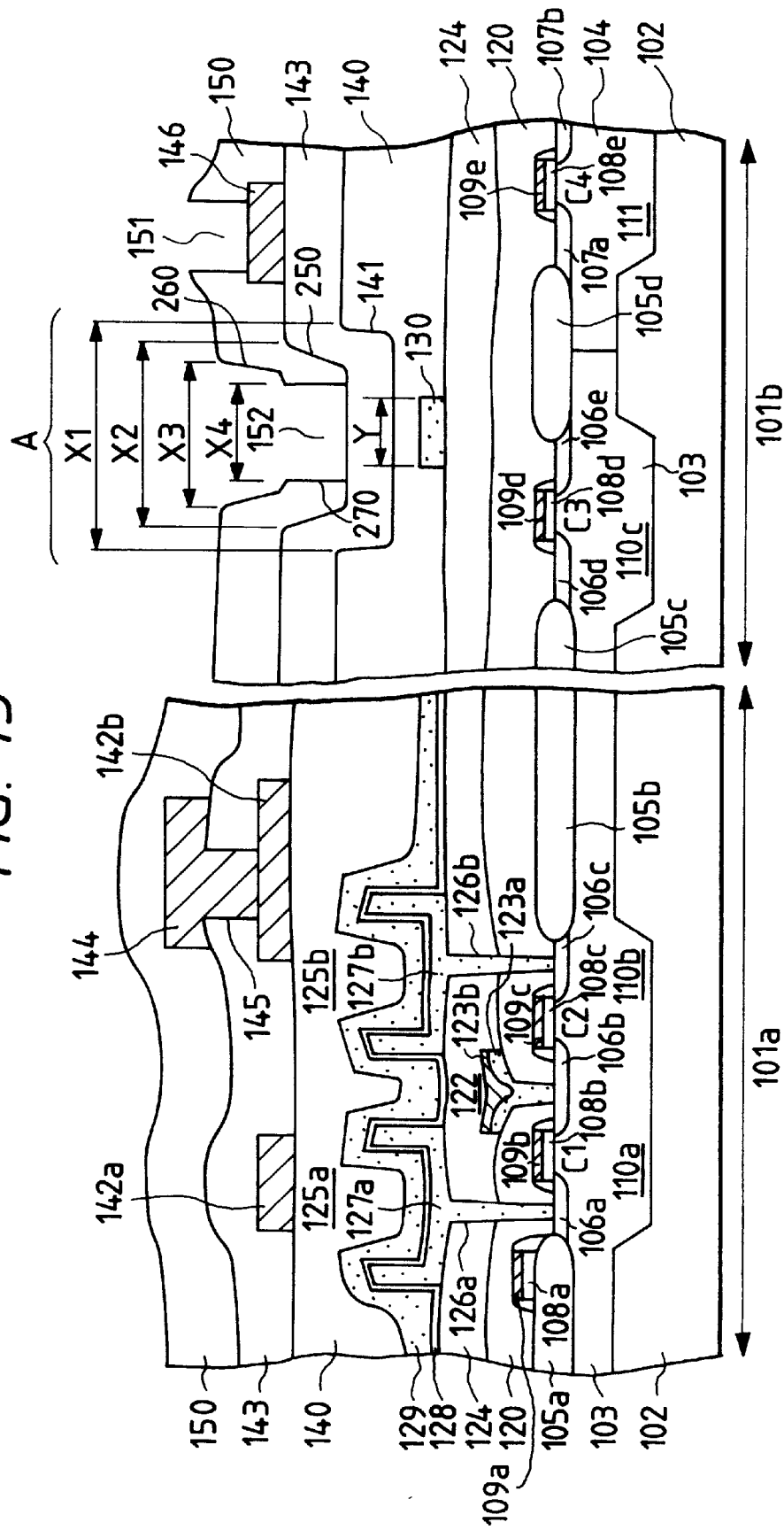

Referring to FIGS. 1 and 13, an explanation will be given of a method of fabricating the DRAM shown in FIG. 1.

As shown in FIG. 3A, element isolation regions 105a to 105d are selectively formed on the one main surface of a p-type semiconductor substrate 102 by the LOCOS (Local Oxidation of Silicon) technique. In the region where an n-well is to be formed, by photolithography, a resist is formed to mask the region of the n-well 3. P-type ions (e.g. boron ions) are ion-implanted to form a p-well 103 having a higher impurity concentration than that of the semiconductor substrate 102. The resist masking the region where the n-well is to be formed is removed and thereafter a resist masking the region of the p-well 103 is formed by photolithography. N-type ions (e.g. phosphorus ions) are ion-implanted to form the n-well 104. Then, the resist is removed.

The entire surface of the well region where MOS transistors 110a to 110c and 111 are to be formed is heat-treated to form a silicon oxide film. An electrode layer of polysilicon ion-doped by the chemical vapor deposition (hereinafter referred to as CVD for brevity) is deposited on the silicon oxide film and element isolation regions 105a to 105b. By photolithography, a resist is formed at necessary portions of the surface, and using the resist as a mask, they are selectively etched away to form the conductive layer 109a and the gate electrodes 109b to 109e. Further, by etching using the conductive layer 109a and the gate electrodes 109b to 109e as a mask, insulating oxide films 108a to 108e are formed. Masking the region of the n-well 104 by resist, n-type ions such arsenic ions are selectively ion-implanted to source/drain regions 106a to 106e of n-type semiconductor. After the resist is removed, by CVD, the conductive layer 109a and the gate electrodes 109b to 109e are covered with a silicon oxide film. By anisotropic etching of the silicon oxide, side wall insulating films are formed.

The region where the p-well 103 is formed in the memory cell array section 101a and peripheral circuit section 101b is masked by a resist. P-type ions such as boron ions are selectively ion-implanted to form the source/drain regions 107a to 107b of p-type semiconductor. The resist formed for masking is removed.

As shown in FIG. 3B, by the CVD technique, an inter-layer insulating film 120 made of a TEOS oxide film is deposited on the entire surface of the memory cell array section 101a and the peripheral circuit section 101b. Thereafter, by etching, a contact hole 201 in contact with the source/drain region 106b is formed in the inter-layer insulating film 120. The etching removal step includes steps of forming, before etching, a resist on predetermined portions using a mask for masking the portions not to be etched and of removing, after etching, the resist. In the following description, as long as there is no particular explanation, it is assumed that before and after etching, the steps of forming the resist and removing it are carried out.

As shown in FIG. 4A, an type polysilicon constituting a connecting portion 123a of the bit line 122 is formed in the contact hole 201 and on the inter-layer insulating film 120 by CVD. On the polysilicon layer, silicide (e.g. Wsi, MoSi) constituting a low resistance portion 123b is deposited by sputtering or CVD. The polysilicon and silicide are selectively etched away to form the bit line 122. Although not shown, this etching removal permits a conductive layer for constituting the peripheral circuit section 101b to be simultaneously formed.

As shown in FIG. 4B, by CVD, an inter-layer insulating film 124 of a TEOS oxide film is deposited on the bit line 122 and on the entire surface of the inter-layer insulating film 120. Thereafter, by etching, contact holes 126a and 126b in contact with the source/drain regions 106a and 106c, respectively, are formed in the inter-layer insulating films 120 and 124.

Figure 5A:
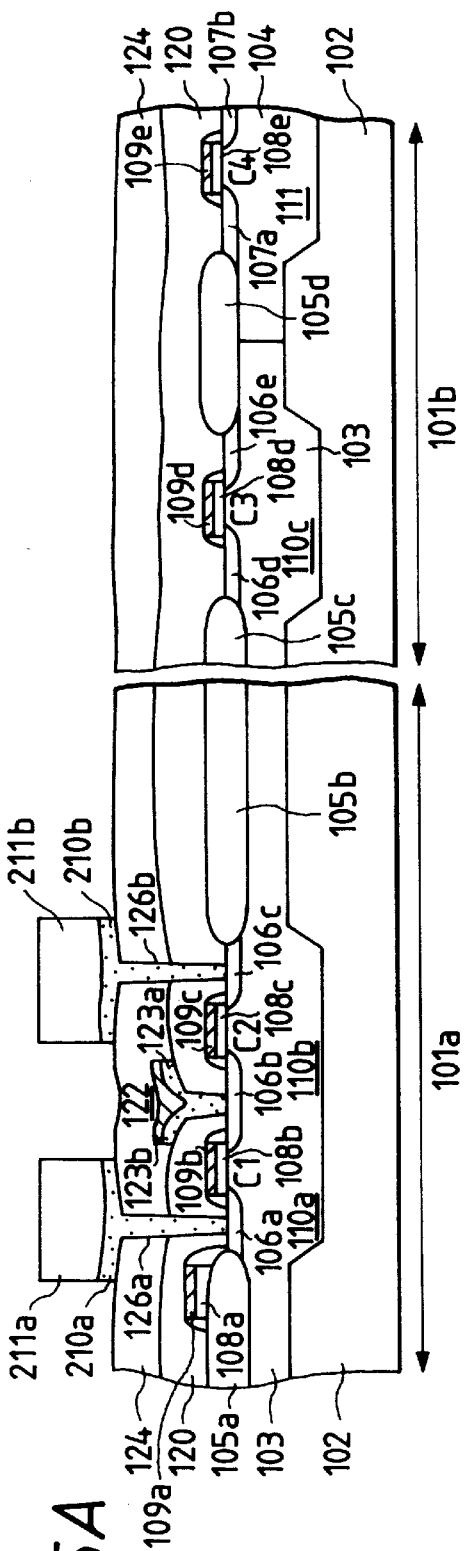

As shown in FIG. 5a, by CVD technic, an n-type polysilicon layer is formed in the contact holes 126a, 126b and the inter-layer insulating film 124 in the memory cell array section 101a and the peripheral circuit section 101b. Further, by CVD, an insulating film of the TEOS oxide film is formed on the entire surface of the n-type polysilicon layer. The laminated polysilicon layer and insulating film are selectively removed by etching so as to form cylinder shapes on center axes of the contact holes 126a and 126b. Thus, as shown in FIG. 5A, the bottoms 210a, 210b of the one electrodes and the remaining insulating films 211a and 211b in the capacitors 125a, 125b are formed in cylindrical shapes.

Figure 5B:
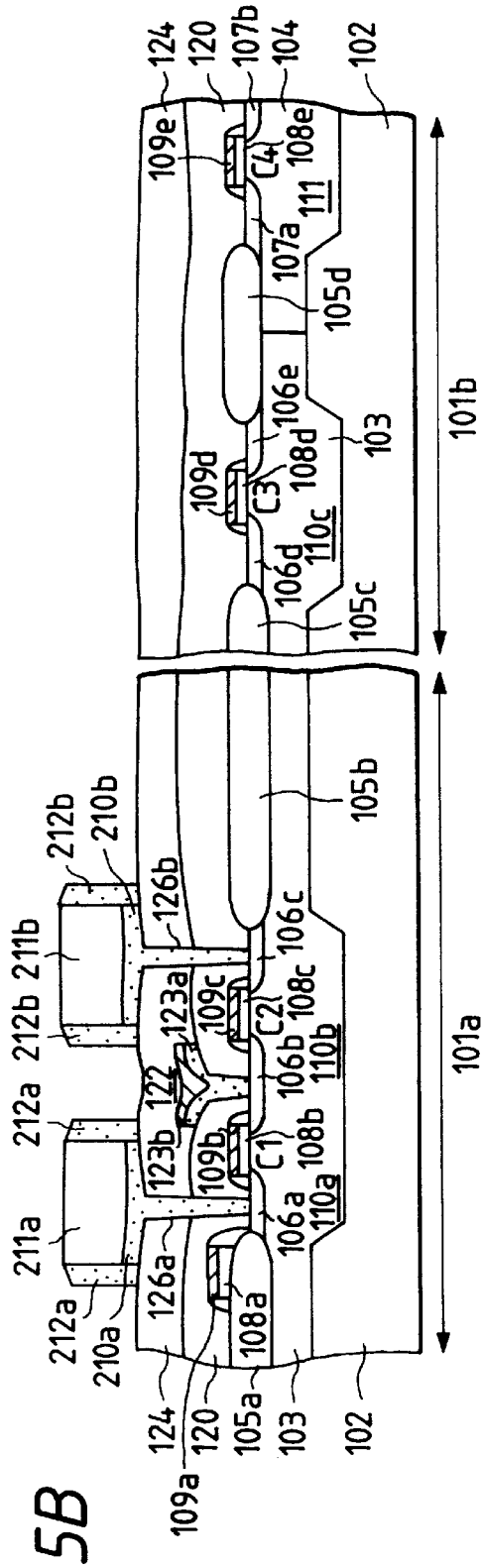

As shown in FIG. 5B, side portions 212a and 212b of capacitors of n-type silicon are formed so as to cover the sides of the bottom 210a and insulating film 211a and bottom 210b and insulating film 211b of the capacitor electrodes. The side portion 212a and 212b are formed as follows. In FIG. 5A, with the entire area of the peripheral circuit section 101b masked by resist by photolithography, by CVD, an n-type polysilicon layer is deposited on the inter-layer insulating film 124 in the memory cell array section 101a so as to cover the bottoms 210a and 210b and the insulating films 211a and 211b, and the polysilicon layer is anisotropically etched to form the side portions 212a and 212b. The bottom 210a and the side portion 212a constitute one electrode 127a of the capacitor 125a, and the bottom 210b and the side portion 212b constitute one electrode 127b of the capacitor 125b.

Figure 6A:
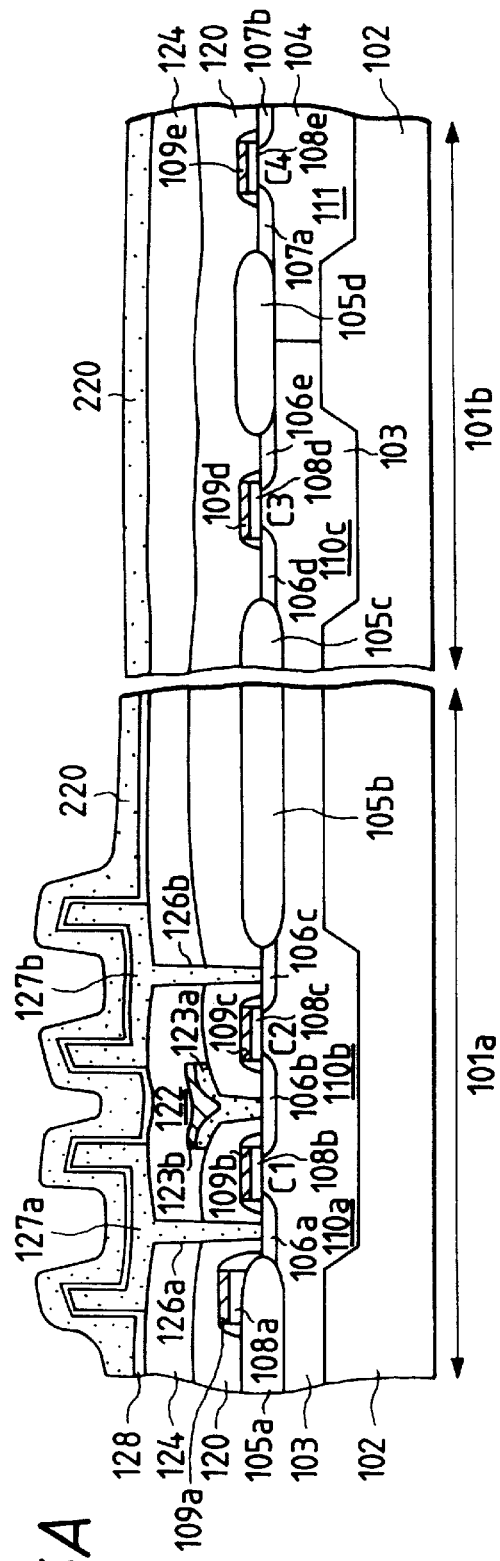

After the insulating films 211a and 211b are removed in FIG. 5B, a capacitor dielectric film 128 is formed on the inter-layer insulating film 124 in the area of the memory array section 101a so as to cover the entire surface of the electrodes 127a and 127b. Because of the presence of the resist having masked the area of the peripheral circuit section 101b in FIG. 5B, the dielectric film 128 is not formed. As shown in FIG. 6A, after the dielectric film 128 is formed, the resist is removed, and by CVD, an n-type doped polysilicon layer 220 is deposited on the entire surface of the peripheral circuit section 101b.

Figure 6B:
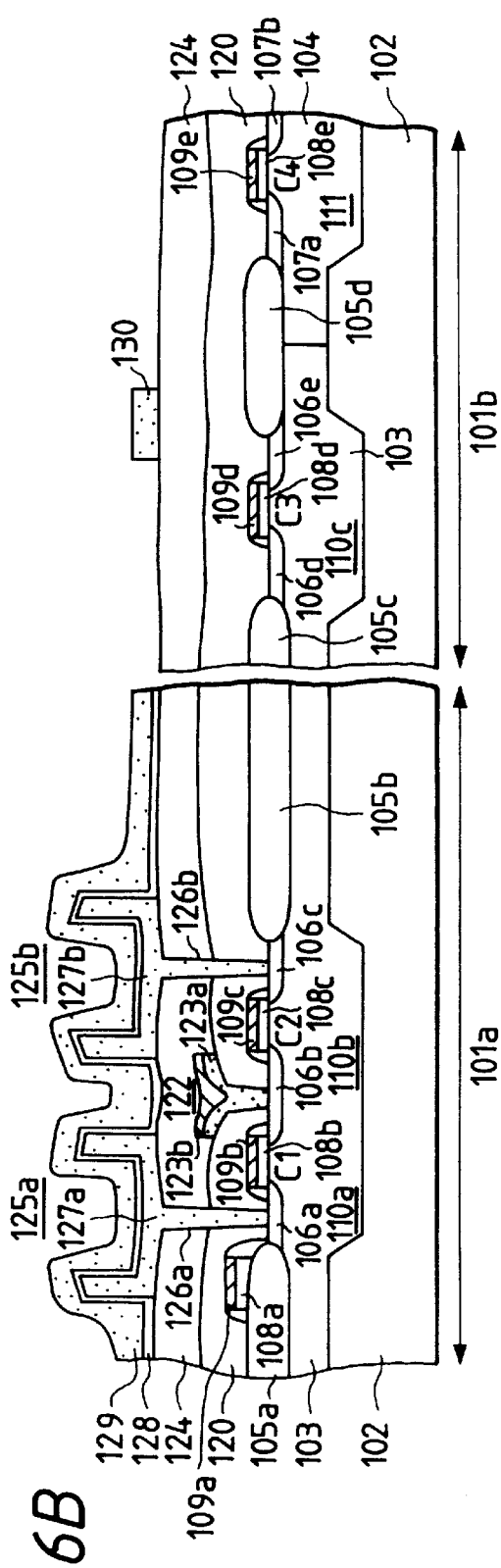

As shown in FIG. 6B, the polysilicon layer 220 of the area of the memory cell array section 101a constitutes a cell plate 129, and that of the area of the peripheral circuit section 101b is selectively removed by etching so as to form a fuse portion 130. As necessity requires, a part of the conductive layer constituting the peripheral circuit can be formed simultaneously with the fuse portion 130 on the inter-layer insulating film 140 by etching the polysilicon layer 220.

Figure 7:
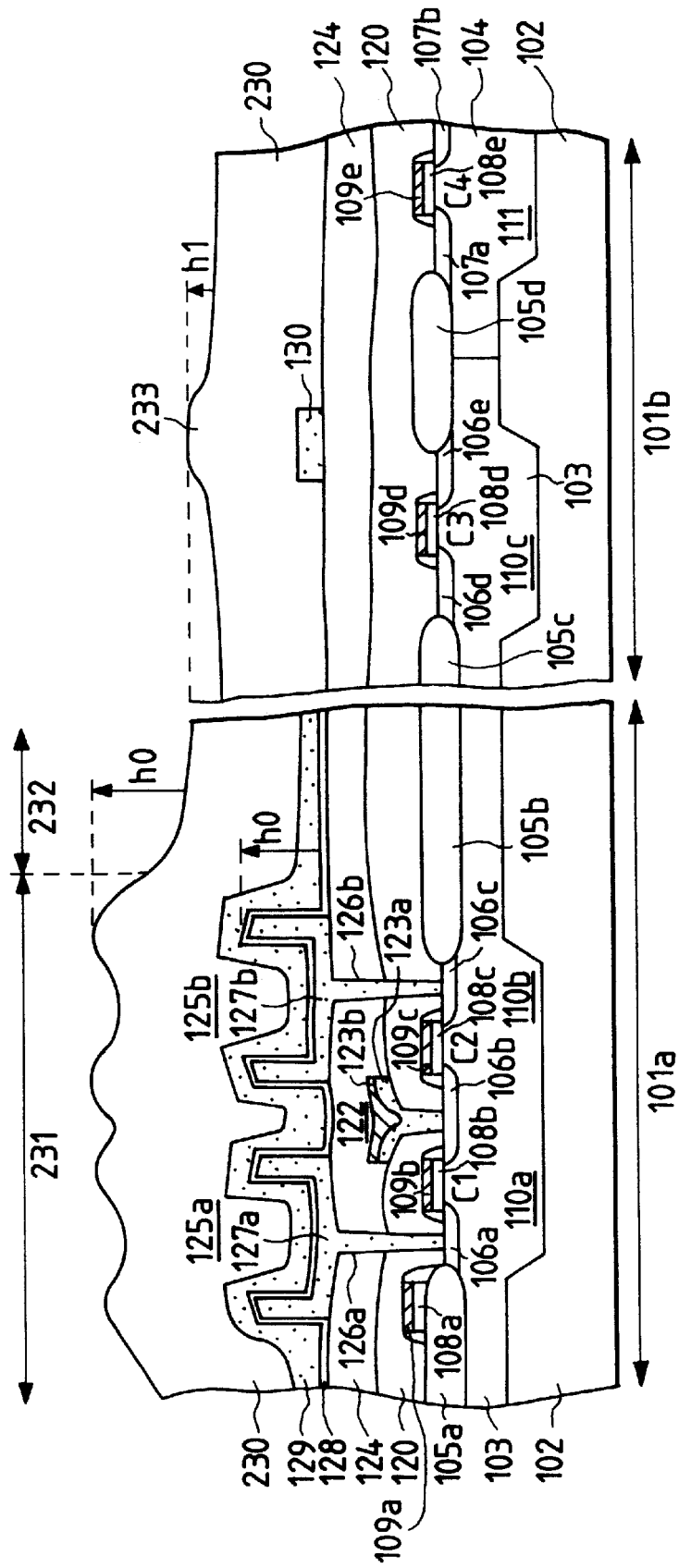
Figure 8:
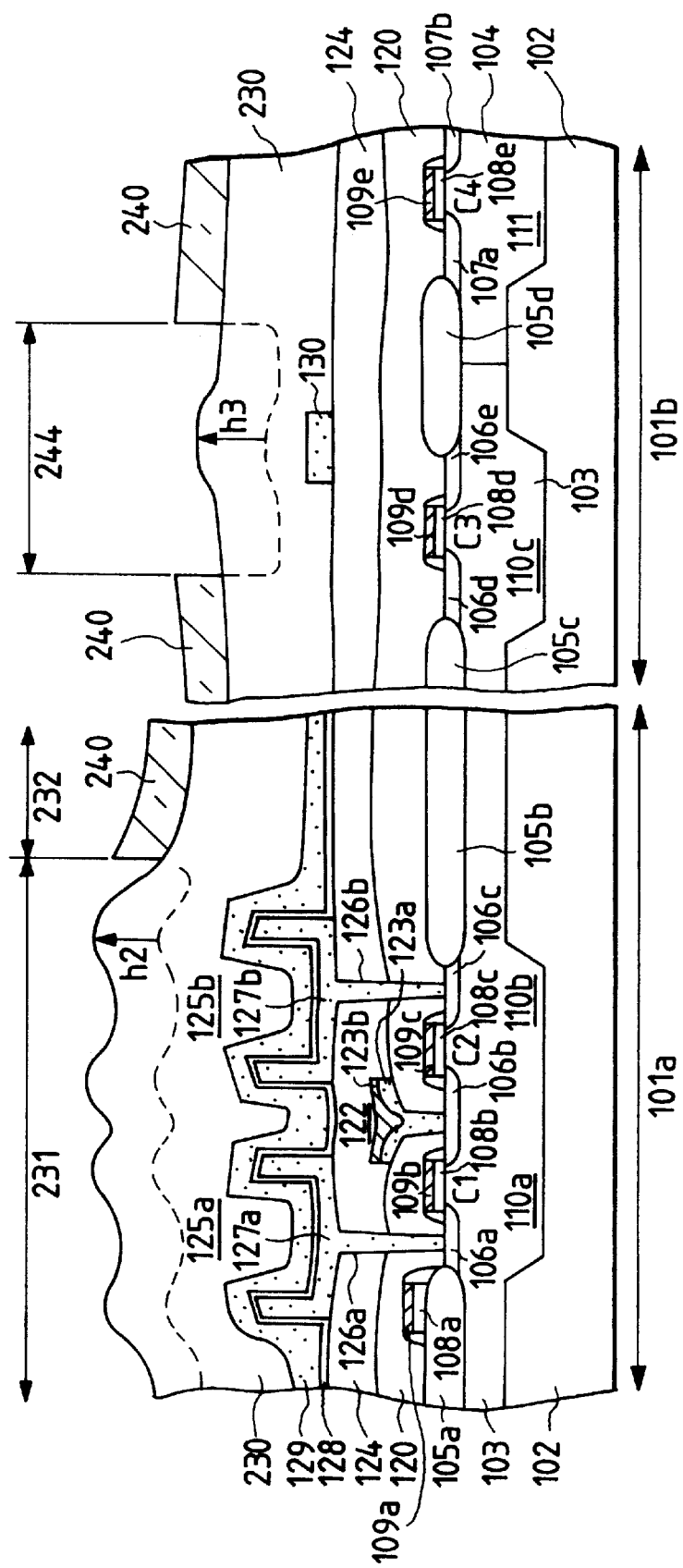

As shown in FIG. 7, by CVD, an inter-layer 230 of an TEOS oxide film is deposited on the entire surface of the memory cell array section 101a and the peripheral circuit section 101b. In the memory cell edge area of the memory cell array section 101a as shown in FIG. 2, on the area located on the cylindrical capacitors 125a and 125b a level difference portion 231 is produced whereas on the remaining area, a flat portion 232 is produced. The level difference portion 231 is protruded from the flat portion 232 by the height approximately equal to the height h0 of the electrodes 127a and 127b of the capacitors 125a and 125b. For example, in this embodiment, this height is about 6000 Å. On the other hand, the surface of the area of the peripheral circuit section 101b is substantially flat except that a convex portion 233 having a height h1 equal to the thickness of the fuse portion 130 is formed above the fuse portion 130. The height h1 of the convex portion 233 is about several hundred Å and is substantially flush with the flat portion 232 of the memory cell array section 101a. Further, since the inter-layer insulating film 230 is deposited on the entire surface by CVD, it has a substantially uniform thickness at respective positions.

Where a metallic wiring layer is to be formed at the boundary between the level difference 231 and flat portion 232 of the inter-layer insulating film 230, a wire break may occur because of the difference between the level difference portion 231 and flat portion 232, or otherwise, poor transfer may occur because of margin shortage in the depth of focus in the transfer process. The level difference potion 231 must be cut away by the degree avoiding such problems (hereinafter referred to as "flattening"). Therefore, the level difference portion is removed by etching. In this case, a concave portion opened in a square shape is also formed on the area located on the fuse portion 130. This intends to reduce the film thickness previously so that the fuse portion can be easily cut by laser irradiation. For this purpose, as shown in FIG. 8, by photolithography, a resist 240 is formed on the flat portion 232 of the memory cell array 231 and on the other portion than the area 244 where the concave portion is to be formed in the peripheral circuit section 101b. This resist 240 can be formed by a single photomask. The portions above from a dotted line in the inter-layer insulating film 230 is removed by etching.

Figure 9:
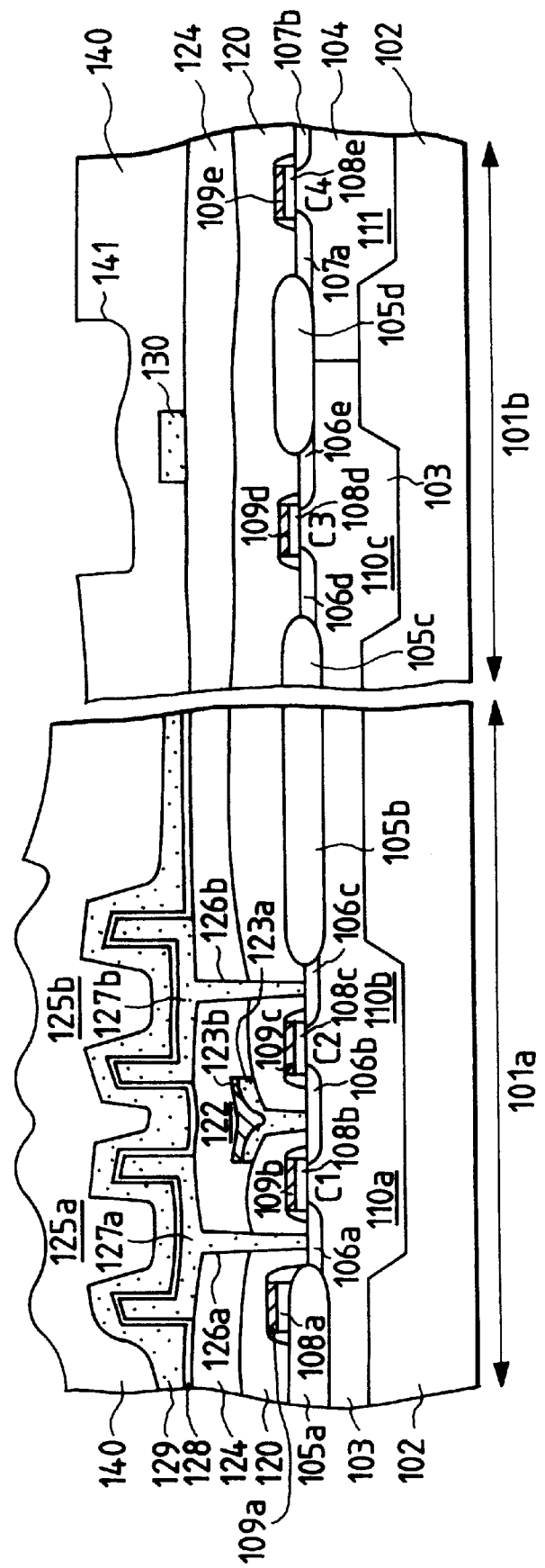

After the resist 240 is removed, as shown in FIG. 9, the level difference portion 231 is flattened and the insulating film 140 with the concave portion 141 formed is obtained. In the flattening process, etching removal is stopped when the level difference portion 231 becomes substantially flush with the flat portion 232 and before the cell plate 129 is exposed. In this case, the portion 244 is simultaneously removed to the same depth (in FIG. 8, h2 and h3 are substantially equal to each other). At this time, etching of the concave portion 141 is ended. In FIG. 7, since the inter-layer insulating film 230 is formed by CVD so as to have a substantially uniform thickness at respective positions, even when the concave portion 141 is formed by etching simultaneously with flattening the level difference portion 231, the fuse portion 130 is not exposed to the bottom of the concave portion 141. The concave portion 141 is formed oppositely to the fuse portion 130 through the inter-layer insulating film 230.

By CVD, an aluminum layer is deposited on the entire surface of the memory cell array section 101a and peripheral circuit section 101b inclusive of the concave portion 141. Thereafter, the aluminum layer is etched to form a wiring layer of aluminum. As seen from FIG. 10, in the area of the memory cell array section 101a, wiring layers 142a and 142b are formed. On the other hand, in the area of the peripheral circuit section 101b, at the positions not shown, a wiring layer is formed to be connected to the source/drain region of a MOS transistor in the area of the peripheral circuit section 101b, and after the structure as shown in FIG. 9, a contact hole for connection to the source/drain region is formed. In the concave portion 141, no wiring layer is formed. By CVD, an inter-layer insulating film 143 of a TEOS oxide film is deposited in the concave portion 141 and on the entire surface of the inter-layer insulating film 140. Therefore, another concave portion 250 is formed on the region where the concave portion 141 is formed. Incidentally, although the surface of the inter-layer insulating film 140 and the bottom of the concave portion 141 are actually uneven as seen from FIG. 9, they are illustrated flatly in FIG. 10 for simplicity of illustration.

Figure 11:
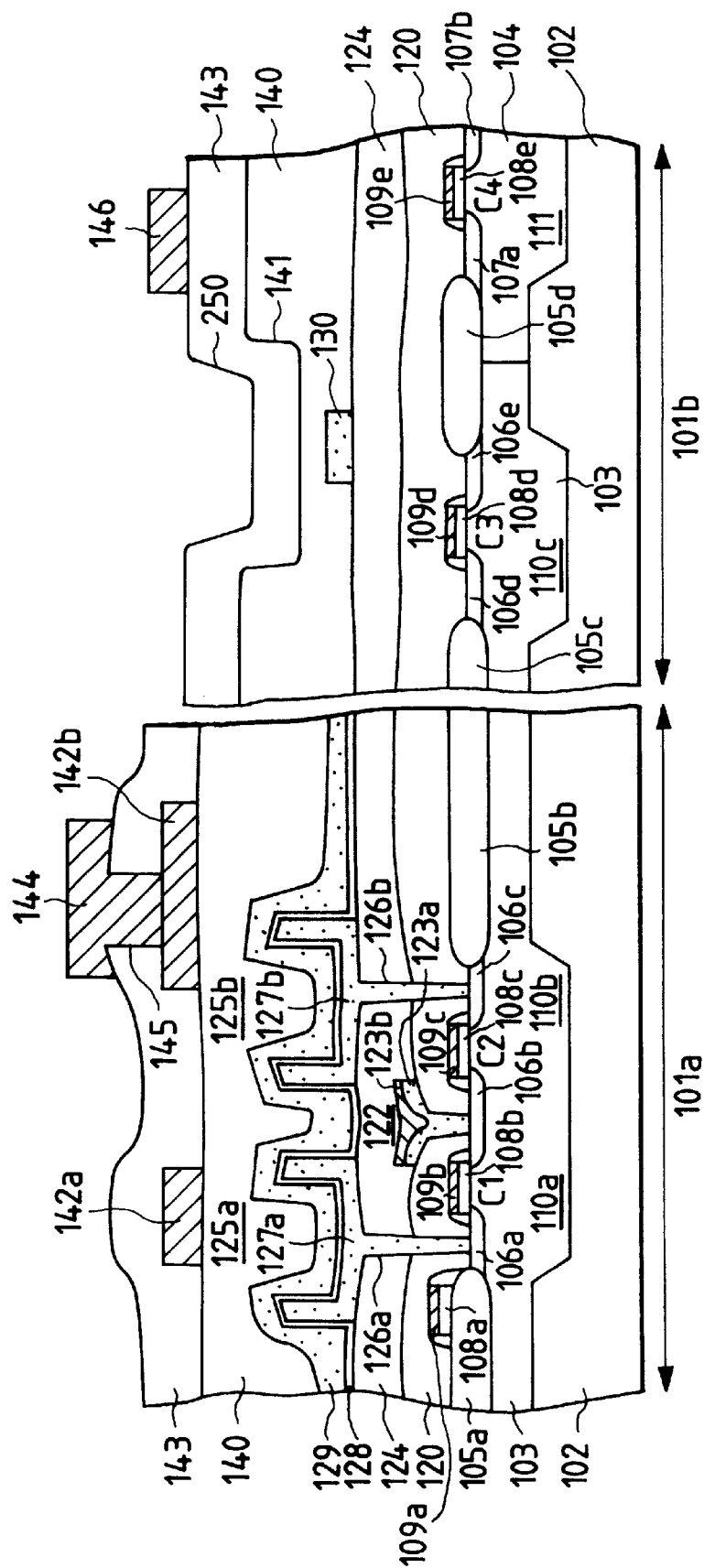

As shown in FIG. 11, by etching, a contact hole 145 for contact with the insulating wiring film 142b is formed in the wiring layer 142b. Thereafter, by CVD, an aluminum layer is deposited on the entire surface of the inter-layer insulating film 143 inclusive of the concave portion 250. By etching, in the area of the memory cell array section 101a, a wiring layer 144 of aluminum connected to the wiring layer 142b through the contact hole 145, whereas in the area of the peripheral circuit section 101b, a wiring layer 146 is formed. It should be noted that the wiring layer 146 is connected to an underlying wiring layer not shown in the inter-layer insulating film 143 through a contact hole. At the stage of FIG. 11, wafer test is carried out by application of a signal to the wiring layer 146. On the basis of the test result, the fuse portion may be directly irradiated with laser light rays. But, in order to prevent the exposed wiring layer from being accidentally damaged by laser irradiation, it is desirable that the laser irradiation is performed after the wiring layer 146 is protected by a passivation film 150.

Figure 12:
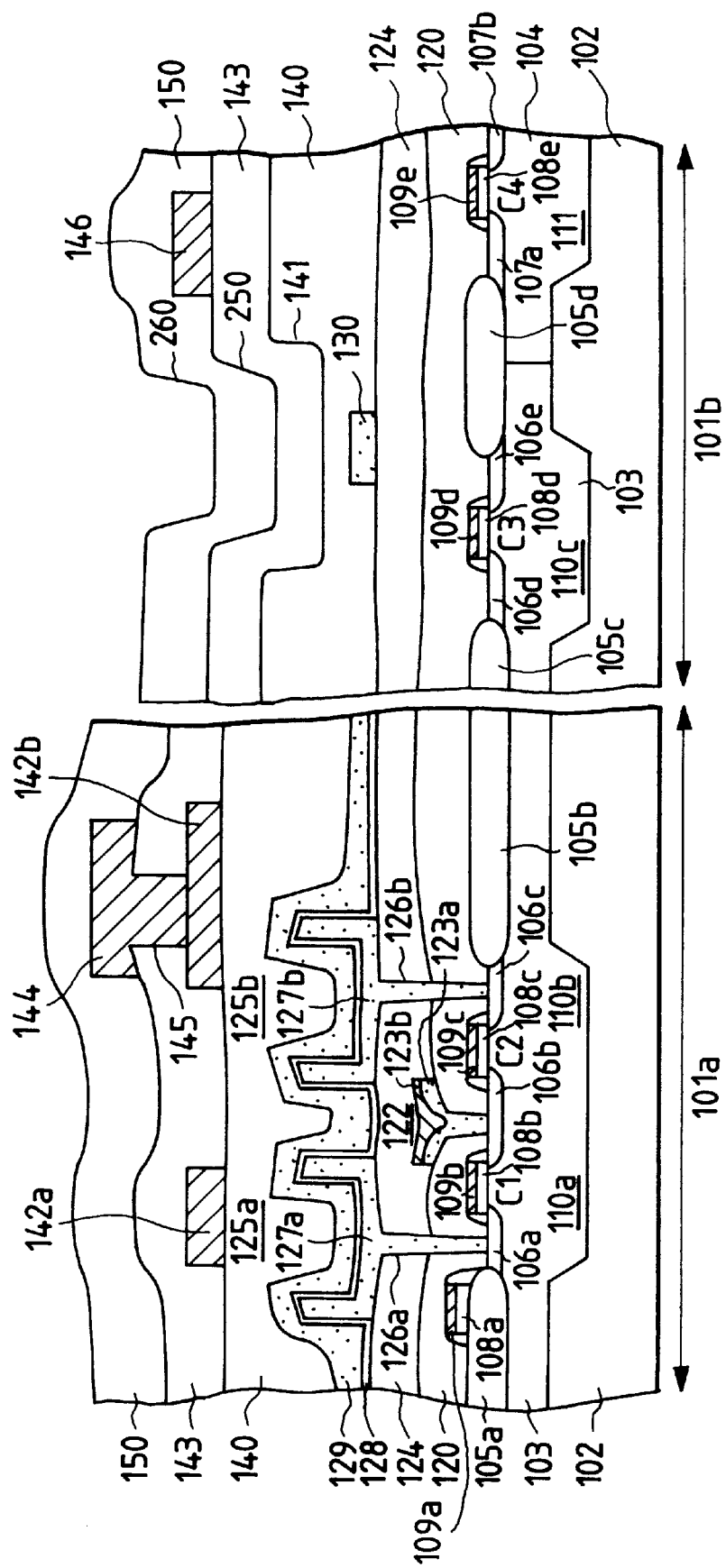

As shown in FIG. 12, by CVD, a passivation film 150 of a silicon nitride film ($Si_3N_4$) is deposited in the concave portion 250 and on the entire surface of the inter-layer insulating film 143. A further concave portion 260 is formed on the region where the concave portion 250 is formed.

The wiring layer 146 is served as an electrode pad of the DRAM. A signal for operating the circuit is applied to the wiring layer 146. As shown in FIG. 13, therefore, at the stage of the wafer test, in order to apply the test signal, an opening 151 for exposing the wiring layer 146 is formed in the passivation film 150. On the bottom of the concave portion 260, a further opening 270 is formed. The openings 151 and 260 can be simultaneously formed by etching the passivation film 150. As shown, the etching is performed to a degree that the surface of the inter-layer insulating film 143 is exposed in the opening 260. The opening 270 and concave portion 260 constitute an opening 152 for laser irradiation. Using a specific etchant in the etching permits a specific material to be selectively etched. Since the inter-layer insulating film 143 and the passivation film 150 are made of different materials, even if the passivation film 150 is over-etched using the etchant etching only the passivation film 150, the inter-layer insulating film 143 is not removed. Thus, over-etching of the passivation film 150 does not lead to the exposure of the fuse portion 130. However, it should be noted that etching for a too long time may over-etch and damage the wiring layer 146 of aluminum. There is actually a slight variation in the film thickness of the passivation film 150. As long as the opening 151 exposes the wiring layer 146, therefore, it is not necessarily required that the inter-layer film 140 is exposed on the bottom of the opening 152, but the passivation film 150 is permitted to remain slightly.

Figure 14:
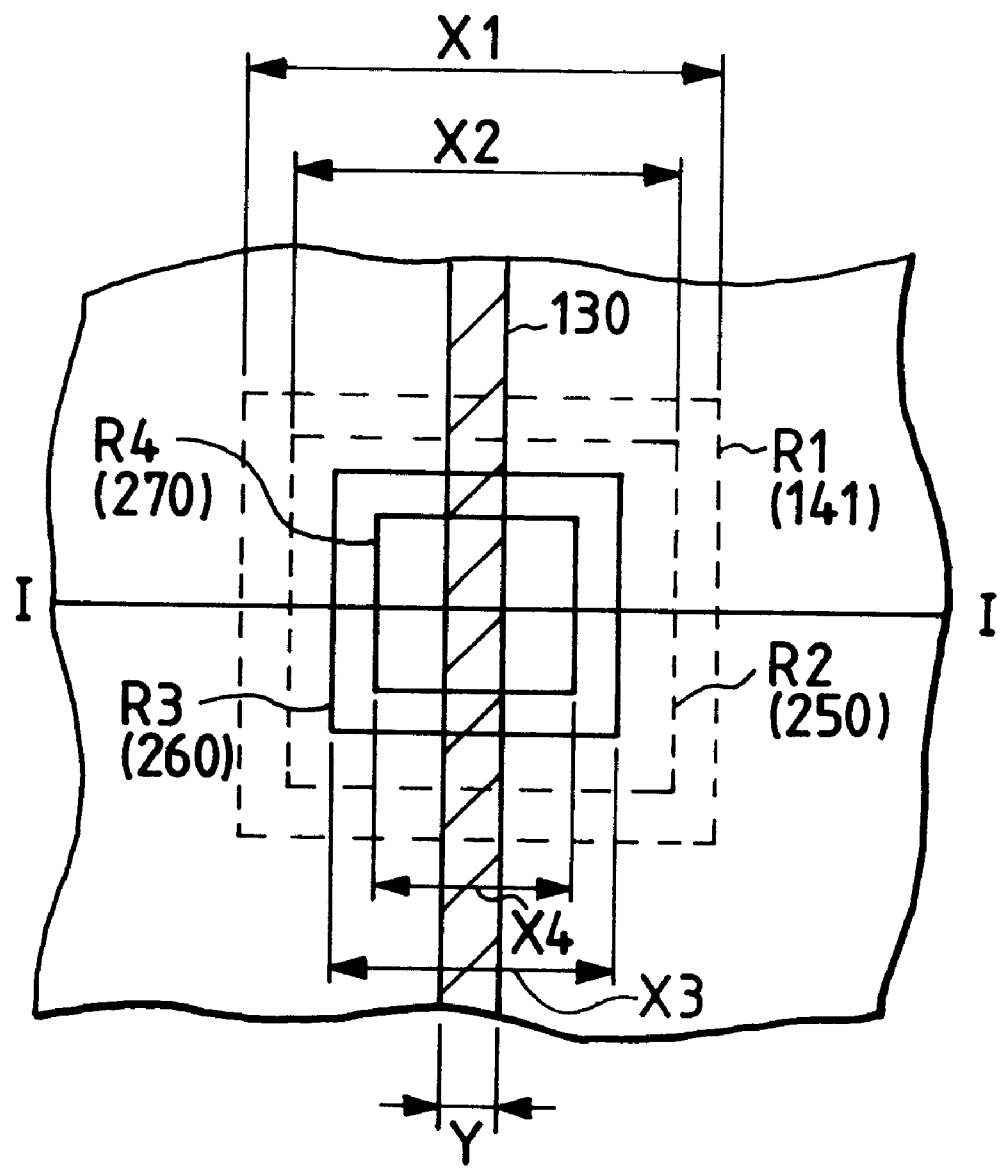
FIG. 14 is a plan view showing an area where a fuse portion 130 in the semiconductor device shown in FIG. 13.

FIG. 14 is a plan view of the area A where the concave portions 141, 250 and 260 are formed in FIG. 13. In FIG. 14, R1 denotes an area of the concave portion 141 formed on the inter-layer insulating film 140; R2 denotes a region of the concave portion 250 formed on the inter-layer insulating film 143; R3 denotes a region of the concave portion 260 formed on the passivation film 150; and R4 denotes a region of the opening 270 formed on the bottom of the concave portion 260 and exposing the inter-layer insulating film 143. X1, X2, X3, X4 and Y denote the respective sectional widths of the concave portions 141, 250, and 260, the openings 270 and fuse portion 130. The area A in FIG. 13 denotes the sectional area in line I—I in FIG. 14. The fuse portion 130 is extended in a direction perpendicular to FIG. 13. The fabricating method according to this embodiment forms the regions R1 to R4 in square shapes in such a configuration that the region R2 is located within the region R1; R3 is located within R2; R4 is located within R3. The opening 270 is formed in such a configuration that the sectional width Y of the fuse portion 130 is located within the sectional width X4 of its region R. Thus, laser light can be precisely focused onto the fuse portion 130 through the opening 152.

In FIG. 13, DRAM is wafer-tested by applying a test signal to the wiring layer 146 through the opening 151. Where the fuse portion 130 must be cut, laser light is projected to the opening 152 for laser irradiation to cut the fuse portion (shown in FIG. 1). Thereafter, the wiring layer 146 serving as an electrode pad is wire-bonded. Finally, the entire chip is packaged with resin.

Incidentally, in the structure as shown in FIG. 12, as long as the fuse portion 130 can be cut through the film thickness from the fuse portion 130 to the bottom of the concave portion 260, the opening 270 is not required but the opening 151 has only to be provided.

In order that the fuse portion can be easily cut, the fuse portion 130 is desired to be formed at a higher position. For example, in FIG. 13, the fuse portion 130 may be formed simultaneously with the aluminum wiring layers 142a and 142b (in this case, the concave portion 141 is not provided). Where a metallic wiring layer is used as the fuse portion, however, the metal having high thermal conductivity scatters energy from laser irradiation so that it is very difficult to effect laser trimming. As a result, the fuse portion is preferably made of preferably a polysilicon layer having lower thermal conductivity than that of metal. In the DRAM according to this embodiment, it is desired that the fuse porion is formed simultaneously with the cell plate 129 of the capacitor.

Figure 18:
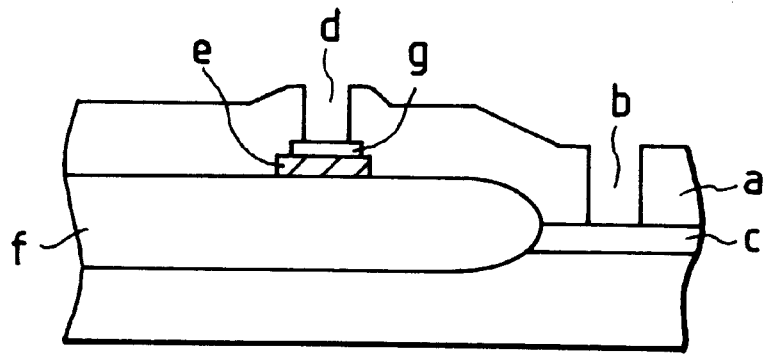
FIG. 18 is a sectional structural view of a conventional semiconductor device.

As in this embodiment, where the first conductive layer constituting the fuse portion and a part of the circuit are formed on the same inter-layer insulating film, the second conductive layer inclusive of the portion located at a higher position than the surface of the fuse portion (in this embodiment, the other member than the cell plate of the cylindrical capacitor may be used), and further the inter-layer insulating film are deposited by CVD, the area of the second conductive layer gives a convex level difference from the region of the first conductive layer. Thus, (a) flattening this level difference and forming the concave portion on the first conductive layer can be carried out in the same etching using the same mask (which is used for forming resist before the etching). And (b) the etching for flattening is carried out to a degree that the second conductive layer is not exposed so that the concave portion is formed so as not to expose the first conductive layer. Accordingly, without forming the passivation film on the fuse portion as shown in FIG. 18, it is possible to prevent the fuse portion from being exposed for protection.

Further, as shown in FIG. 13, since the opening 270 located above the fuse portion in the insulating film (the passivation film in this embodiment) overlying the inter-layer insulating film 124 on which the fuse portion is formed, the film thickness from the fuse portion to the bottom of the opening 270 immediately thereabove can be reduced. This makes it easy to cut the fuse portion by laser irradiation. In this case, since the opening 270 is formed in the same etching step simultaneously with the opening 150 exposing the wiring layer 146, the openings 151 and 270 can be formed using the same mask. This permits the number of fabricating steps to be reduced.

Embodiment 2

Figure 10:
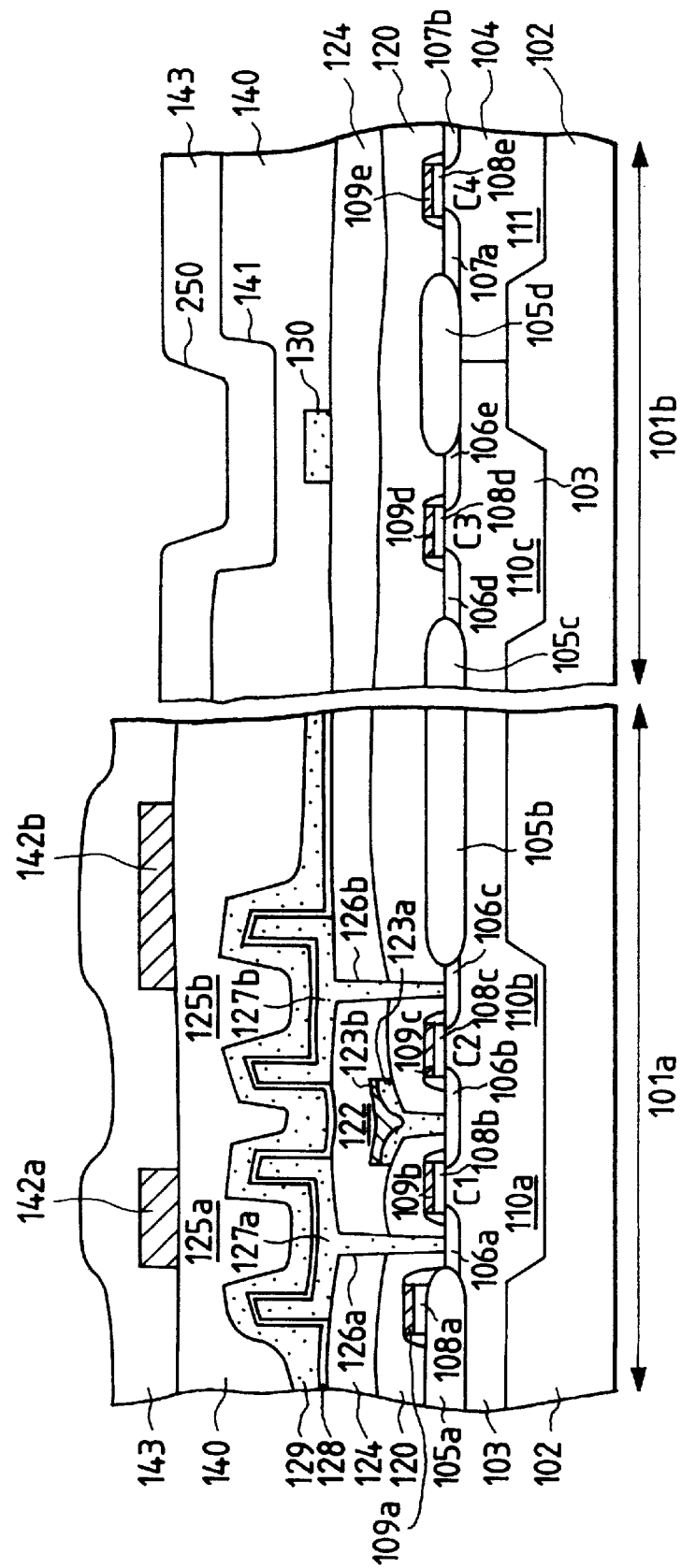

Now, referring to FIGS. 15 and 16, an explanation will be given of another embodiment of the present invention. As seen from FIG. 10 of the first embodiment, the inter-layer insulating film 143 is deposited on the inter-layer insulating film 140, and as seen from FIG. 11, the contact hole in contact with the wiring layer 142b is formed in the inter-layer insulating film 143. This embodiment is different from the first embodiment in that after the structure of FIG. 10 is formed, as shown in FIG. 15A, by etching, an opening 300 is formed in a region of the concave portion 141 simultaneously with the contact hole 145.

Figure 16:
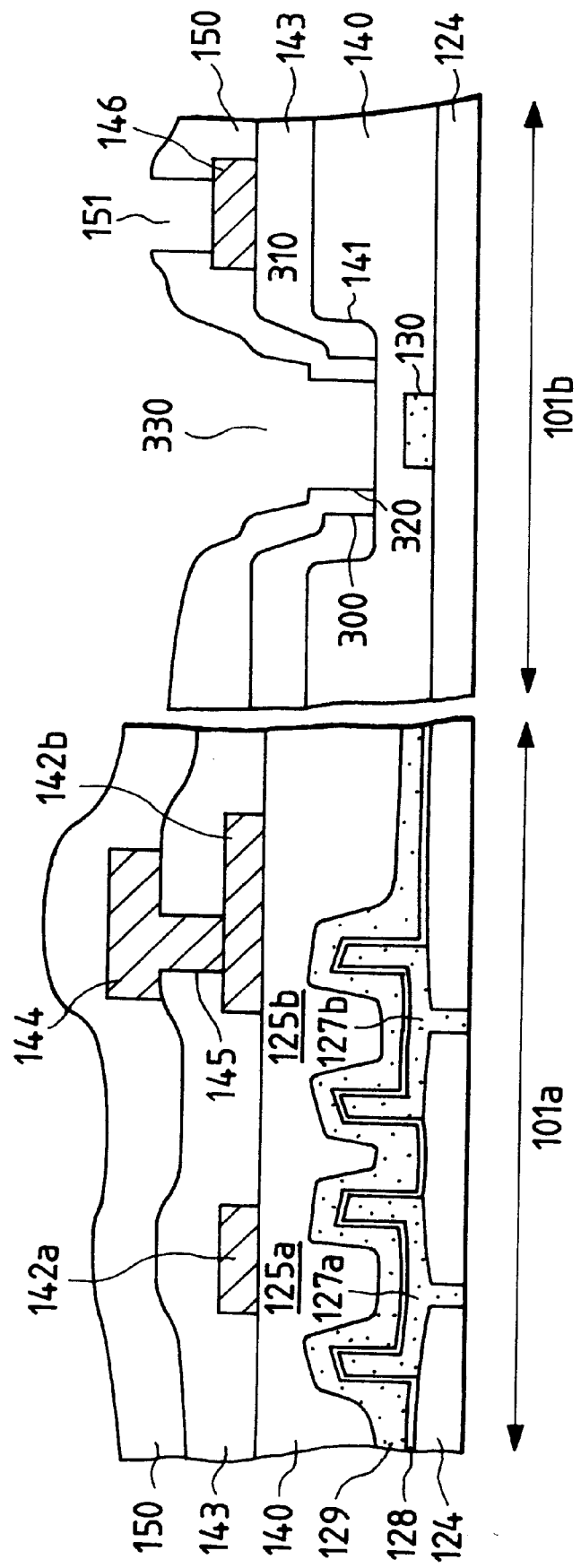
Figure 17A:
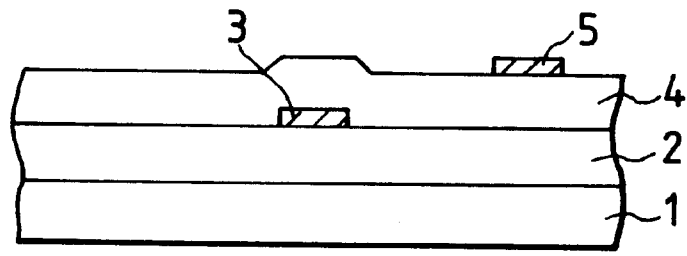
FIGS. 17A to 17C are an explanation view showing a conventional method of fabricating a semiconductor device.
Figure 17B:
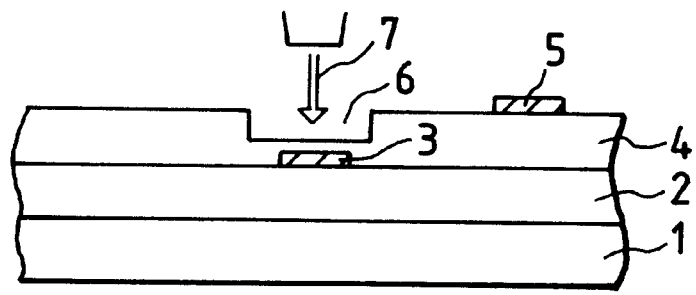
Figure 17C:
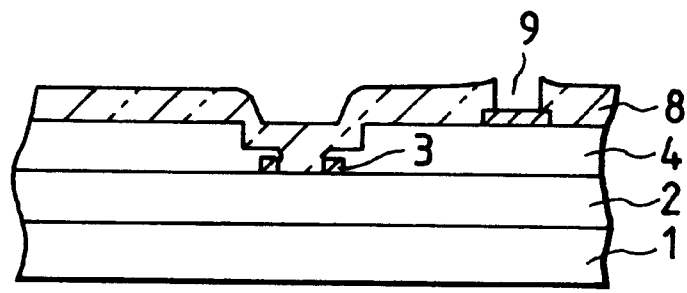

In FIGS. 15 and 16, like reference numerals refer to like parts in FIGS. 3 to 13. Although the structure underlying the inter-layer insulating film 124 is not shown, it is assumed that the same structure has been formed by the same process as in FIGS. 3 to 13.

First, in FIG. 10, using a single mask, a resist is formed on the surface of the inter-layer 143 other than the regions of the contact hole 145 and the concave portion 300, and subsequently etching is performed. Since the inter-layer insulating film 143 is formed substantially uniformly by CVD, in FIG. 10, the inter-layer insulating film 143 immediately on the wiring layer 142b has a thickness approximately equal to that of the inter-layer insulating film 143 on the concave portion 141. The etching is ended when the contact hole 145 exposes the wiring layer 142b and the opening 300 exposes the inter-layer insulating film 140 on its bottom. Thus, the bottom of the opening 300 is formed oppositely to the fuse portion 130 through the inter-layer insulating film 140. There is actually a slight variation in film thickness of the inter-layer insulating films 143. As long as the opening 145 exposes the wiring layer 142, therefore, it is not necessarily required that the bottom of the opening 300 exposes the inter-layer insulating film 140, but the passivation film 143 is permitted to remain slightly.

In FIG. 15B, on the inter-layer insulating film 143, on the side of the memory cell array section 101a, a wiring layer 144 is formed through the contact hole 145 whereas on the side of the peripheral circuit section 101b, a wiring layer 146 serving as an electrode pad is formed. The wiring layers 144 and 146 can be formed in such a way that after an aluminum layer is formed in the contact hole 145 and the opening 300 and on the entire surface of the inter-layer insulating film 143, this aluminum layer is selectively removed by etching. Thereafter, by CVD, a passivation film 150 of a silicon nitride film ($Si_3N_4$) is deposited in the opening 300 and on the entire surface of the inter-layer insulating film 143. A further concave portion 310 is formed on the area where the opening 300 is formed.

In FIG. 16, the passivation film 150 is selectively etched away so as to from an opening 151 for applying a signal to the wiring layer 146 and an opening 320 further advanced from the bottom of the concave portion 310. Since the passivation film 150 is substantially uniformly deposited by CVD, in FIG. 15B, the thickness of the passivation film 150 immediately on the wiring layer 146 is approximately equal to that of the passivation film 320 in the concave portion 300. Therefore, simultaneously with exposure of the wiring layer 146 by the opening 151, the inter-layer insulating film 140 is exposed to the bottom of the concave portion 320. At this time, the etching is ended. The concave portion 320 is formed in the concave portion 300, and its bottom (exposed surface of the inter-layer insulating film 140) is formed oppositely to the fuse portion 130. The concave portion 310 and the opening 320 constitute an opening 330 for laser irradiation.

As in the first embodiment, using a specific etchant in the etching permits a specific material to be selectively etched. Since the inter-layer insulating film 140 and the passivation film 150 are made of different materials, even if the passivation film 150 is over-etched using the etchant etching only the passivation film 150, the inter-layer insulating film 140 at the bottom of the concave portion 320 is not further removed. Thus, over-etching of the passivation film 140 does not lead to the exposure of the fuse portion 130.

In the state of FIG. 16, a test signal is applied to the wiring layer 146 serving as an electrode pad. If the fuse portion 130 must be cut as a result of the test, the opening 330 is irradiated with laser light rays to cut the fuse porion 130.

In this embodiment, since the contact hole in contact with the wiring layer 142b as well as the opening 300 located at the fuse portion 130 are formed in the inter-layer insulating film 143 formed on the inter-layer insulating film 140, as compared with the first embodiment, the film thickness from the fuse portion 130 to the laser irradiation face can be further reduced, thus permitting the fuse portion 130 to be easily cut by laser irradiation. Further, where the openings 300 and 320 are formed by etching, the inter-layer insulating film 140 protects the fuse portion 130 so that it is not exposed and not accidentally cut. Since the concave portion 300 is formed simultaneously with the contact hole in the same inter-layer insulating film, they can be simultaneously formed using a single mask, thereby reducing the number of fabricating steps.

Incidentally, in the structure as shown in FIG. 15B, as long as the fuse portion 130 can be cut by laser irradiation through the film thickness from the fuse portion 130 to the surface of the passivation film 150, the concave portion 320 is not particularly required in FIG. 16 but the opening 151 has only to be provided.

As explained referring to FIGS. 7 and 8 in connection with the first embodiment, the level difference portion 231 have been formed on the inter-layer insulating film 230 on the cylindrical capacitors 125a and 125b in the area of the memory array section 101a. This level difference portion 231, which would lead to a break in the wiring on the inter-layer insulating film 230 has been removed. The level difference potion 231, however, is not required to be removed as long as no trouble occurs in forming the wiring on the inter-layer insulating film, and so the process of flattening can be omitted. In this case, where the concave portion 141 is formed above the fuse portion 130, it must be formed by an individual process, thus inconveniently increasing the number of the fabricating steps. In contrast, in order to avoid this advantage, where the concave portion 141 is not formed, the film thickness from the surface of the fuse portion 130 to the opening 330 is increased by the thickness of the concave portion 141. As long as the thickness is enough to cut the fuse portion 130 by laser irradiation, provision of the concave portion 141 is not required. In the multi-layer wiring structure including three or more layers as well as the double layer wiring structure in this embodiment, the opening is formed above the fuse portion simultaneously with the contact hole opened in the insulating layer deposited on each wiring layer, and such a step is repeated for each insulating layer. Thus, the film thickness from the fuse portion to the opening for laser irradiation can be reduced.

What is claimed is:

1. A method of fabricating a semiconductor device comprising the steps of:

forming a first insulating film constituting a first inter-layer insulating film on a principle surface of a semiconductor substrate;

forming, on said first insulating film, a first conductive layer constituting a fuse portion on said first insulating film and a second conductive layer constituting a part of a circuit to be formed on a semiconductor substrate;

depositing a second insulating film constituting a second inter-layer insulating film on the first insulating film so as to cover the first and second conduction layers; and selectively etching the second insulating layer to remove a convex level difference of the surface area of the second insulating film located above the second conductive layer from that located above said first conductive layer to a degree that said second conductive layer is not exposed and also to form a concave portion in the surface of the second insulating film so that its bottom is opposite to said first conductive layer through the second insulating film.

2. The method of fabricating a semiconductor device according to claim 1, further comprising the steps:

depositing a third insulating film on said second insulating film inclusive of said concave portion;

forming a third conductive layer on the surface of said third insulating film at the other area than an area located at the concave portion;

depositing a fourth insulating film on said third insulating film inclusive of the area located at the concave portion so as to cover said third conductive layer; and selectively etching said fourth insulating film so as to make simultaneously, from its surface, a first opening in contact with said third conductive layer and a second opening having a bottom opposite to said first conductive layer through said second and third insulating film.

3. The method of fabricating a semiconductor device according to claim 2, wherein said third insulating film and said fourth insulating film are made of different materials.

4. The method of fabricating a semiconductor device according to claim 2, wherein said third insulating film is made of an oxide film and said fourth insulating film is made of a nitride film.

5. The method of fabricating a semiconductor device according to claim 1, further comprising:
   forming a third conductive layer on the surface of said second insulating film at the other area than an area located at the concave portion;
   depositing a third insulating film on said second insulating film inclusive of the area located at the concave portion so as to cover said third insulating film; and
   selectively etching said third insulating film so as to make simultaneously, from its surface, a first opening in contact with said third conductive layer and a second opening having a bottom opposite to said first conductive layer through said second insulating film.

6. The method of fabricating a semiconductor device according to claim 1, wherein said second conductive layer serves as an electrode opposite to the other electrode of a cylindrical capacitor formed on said first insulating film and whose axis is perpendicular to the principal surface of said semiconductor substrate.

7. A method of fabricating a semiconductor device comprising the steps of:
   forming a first insulating film constituting a first inter-layer insulating film on a principle surface of a semiconductor substrate;
   forming, on said first insulating film, a first conductive layer constituting a fuse portion on said first insulating film and a second conductive layer constituting a part of a circuit to be formed on a semiconductor substrate;
   depositing a second insulating film constituting a second inter-layer insulating film on the first insulating film so as to cover the first and second conductive layers;
   forming a third conductive layer constituting a wiring layer on the surface of said second insulating film at the other area than an area located above said first conductive layer;
   depositing a third insulating film on said second insulating film inclusive of the area located above the first conductive layer so as to cover said third conductive layer;
   selectively etching said third insulating film so as to make simultaneously, from its surface, a first opening in contact with said third conductive layer and a second opening having a bottom opposite to said first conductive layer through said second insulating film;
   forming a fourth conductive layer constituting a wiring layer on the surface of said third insulating film at the other area than an area located at said second opening, said fourth conductive layer including a portion connected to said third conductive layer through said first opening;
   depositing a fourth insulating film in said second opening and on said third insulating film inclusive of the area located above the first conductive layer so as to cover said fourth conductive layer; and
   selectively etching said fourth insulating film so as to make simultaneously, from its surface, a third opening in contact with said fourth conductive layer and a fourth opening having a bottom opposite to said first conductive layer through said second insulating film in said second opening.

8. The method of fabricating a semiconductor device according to claim 7, wherein said second conductive layer serves as an electrode opposite to the other electrode of a cylindrical capacitor formed on said first insulating film and whose axis is perpendicular to the principal surface of said semiconductor substrate.

9. A method of fabricating a semiconductor device comprising the steps of:
   forming a first insulating film above a principle surface of a semiconductor substrate;
   forming a first segment and a second segment both formed by a first conductive layer on said first insulating film, said first segment including a fuse portion;
   depositing a second insulating film above said first insulating film so as to cover said first and second segments; and
   selectively etching said second insulating film from a surface area of said second insulating film located above said first and second segments to a degree that said first and second segments are not exposed, whereby a concave portion is formed in the surface of said second insulating film located above said first segment, a bottom of the concave portion being opposite to said first segment through said second insulating film.

10. The method of fabricating the semiconductor device according to claim 9, wherein said semiconductor device comprises a memory cell including a transistor formed in the principle surface of the semiconductor substrate and a capacitor having an electrode connected to one of a source and a drain of said transistor and having the other electrode which formed by said second segment.

11. The method of fabricating the semiconductor device according to claim 10, wherein said electrode connected to the source or the drain of said transistor is cylindrical whose axis is substantially perpendicular to the principal surface of said semiconductor substrate.

12. A method of fabricating a semiconductor device comprising the steps of:
   forming a first insulating film above a principle surface of a semiconductor substrate;
   forming a first segment formed by a first conductive layer on said first insulating film, said first segment including a fuse portion;
   forming a second insulating film on said first insulating film so as to cover said first segment;
   forming an interconnection segment formed by a second conductive layer above said second insulating film and located at a region excluding an area above said fuse portion;
   depositing a third insulating film above said second insulating film so as to cover said interconnection segment; and
   selectively etching said third insulating film from a surface area of said third insulating film located above said fuse portion and on said interconnection segment, whereby a first hole in contact with said interconnection segment and a second hole above said fuse portion are simultaneously formed, the second hole having a bottom opposite to said fuse portion with said second insulating film therebetween.

13. The method of fabricating the semiconductor device according to claim 12, wherein said second and third insulating films are made of different materials.

14. The method of fabricating the semiconductor device according to the claim 13, wherein said second insulating film is made of an oxide film and said third insulating film is made of a nitride film.

* * * * *